US012813331B2

(12) United States Patent
Lee et al.

(10) Patent No.: US 12,813,331 B2
(45) Date of Patent: Nov. 24, 2026

(54) DISPLAY DEVICE AND METHOD OF MANUFACTURING THE SAME

(71) Applicant: Samsung Display Co., LTD., Yongin-si (KR)

(72) Inventors: Se Hyun Lee, Yongin-si (KR); Dong Woo Kim, Yongin-si (KR); Min Gyeong Shin, Yongin-si (KR); Hak Sun Chang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 671 days.

(21) Appl. No.: 17/702,257

(22) Filed: Mar. 23, 2022

(65) Prior Publication Data

US 2023/0012528 A1 Jan. 19, 2023

(30) Foreign Application Priority Data

Jul. 15, 2021 (KR) ........................ 10-2021-0093116

(51) Int. Cl.
*H10H 29/49* (2025.01)
*H10W 90/00* (2026.01)

(52) U.S. Cl.
CPC ............ *H10W 90/00* (2026.01); *H10H 29/49* (2025.01)

(58) Field of Classification Search
CPC ... H01L 25/0753; H01L 25/167; H10H 29/24; H10H 29/29; H10H 29/142; H10H 29/49; H10H 29/8321; H10H 20/857; H10H 20/831
See application file for complete search history.

(56) References Cited

U.S. PATENT DOCUMENTS

| | | | | |
|---|---|---|---|---|
| 11,101,257 | B2 | 8/2021 | Kim et al. | |
| 11,798,954 | B2 | 10/2023 | Chang et al. | |
| 11,961,950 | B2 | 4/2024 | Kim et al. | |
| 12,268,063 | B2 | 4/2025 | Liu et al. | |
| 2020/0013929 | A1* | 1/2020 | Lee | H10D 30/0295 |
| 2020/0051962 | A1* | 2/2020 | Heo | H10D 86/60 |
| 2020/0066699 | A1* | 2/2020 | Kim | H01L 27/1248 |

(Continued)

FOREIGN PATENT DOCUMENTS

| | | | |
|---|---|---|---|
| CN | 112437987 | A | 3/2021 |
| CN | 112736096 | A | 4/2021 |

(Continued)

OTHER PUBLICATIONS

International Search Report corresponding to International Application No. PCT/KR2022/010064 dated Oct. 20, 2022.

*Primary Examiner* — Molly K Reida
(74) *Attorney, Agent, or Firm* — Womble Bond Dickinson (US) LLP

(57) ABSTRACT

A display device includes a first electrode and a second electrode disposed on a substrate, at least one light emitting element including a first semiconductor layer including a semiconductor of a first type, a second semiconductor layer including a semiconductor of a second type different from the first type, and an active layer disposed between the first semiconductor layer and the second semiconductor layer, and a third electrode disposed on the substrate and electrically connected to the second electrode. At least a portion of the third electrode is disposed between the first electrode and the second electrode in a plan view.

14 Claims, 15 Drawing Sheets

(56) References Cited

U.S. PATENT DOCUMENTS

| | | | | |
|---|---|---|---|---|
| 2021/0159250 | A1* | 5/2021 | Chang | G09G 3/3233 |
| 2021/0202452 | A1 | 7/2021 | Kim et al. | |
| 2022/0005790 | A1* | 1/2022 | Watanabe | H10D 30/6734 |
| 2022/0375990 | A1 | 11/2022 | Im et al. | |
| 2022/0393071 | A1 | 12/2022 | Moon et al. | |

FOREIGN PATENT DOCUMENTS

| | | | |
|---|---|---|---|
| CN | 112951867 | A | 6/2021 |
| KR | 10-2016-0006339 | | 1/2016 |
| KR | 10-2020-0006209 | | 1/2020 |
| KR | 10-2020-0022061 | | 3/2020 |
| KR | 10-2021-0029337 | | 3/2021 |
| KR | 10-2021-0055831 | A | 5/2021 |
| KR | 10-2021-0075292 | | 6/2021 |
| KR | 10-2021-0086805 | | 7/2021 |

* cited by examiner

DISPLAY DEVICE AND METHOD OF MANUFACTURING THE SAME

CROSS-REFERENCE TO RELATED APPLICATION(S)

This application claims priority to and benefits of Korean Patent Application No. 10-2021-0093116 under 35 U.S.C. § 119 filed on Jul. 15, 2021 in the Korean Intellectual Property Office, the entire contents of which are incorporated herein by reference.

BACKGROUND

1. Technical Field

The disclosure relates to a display device and a method of manufacturing the same.

2. Description of the Related Art

In recent years, as interest in information displays is increasing, research and development for display devices are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device in which light emission efficiency is improved and a short defect between electrode configurations is prevented, and a method of manufacturing the same.

Objects of the disclosure are not limited to the above-described objects, and other technical objects which are not described will be clearly understood by those skilled in the art from the following description.

According to an embodiment, a display device may include a first electrode and a second electrode disposed on a substrate; at least one light emitting element including a first semiconductor layer including a semiconductor of a first type; a second semiconductor layer including a semiconductor of a second type different from the first type; and an active layer disposed between the first semiconductor layer and the second semiconductor layer; and a third electrode disposed on the substrate and electrically connected to the second electrode, and at least a portion of the third electrode may be disposed between the first electrode and the second electrode in a plan view.

According to an embodiment, the second electrode and the third electrode may physically contact each other.

According to an embodiment, the first electrode and the second electrode may be spaced apart in a first direction, the first electrode and the third electrode may be spaced apart in the first direction, and the first electrode, the second electrode, and the third electrode may extend in a second direction intersecting the first direction.

According to an embodiment, the first semiconductor layer may be closer to the second electrode than to the first electrode, the second semiconductor layer may be closer to the first electrode than to the second electrode, and a height of the first semiconductor layer may be greater than a height of the second semiconductor layer in a direction from the first semiconductor layer to the second semiconductor layer.

According to an embodiment, the first semiconductor layer may include an N-type semiconductor, and the second semiconductor layer may include a P-type semiconductor.

According to an embodiment, the second semiconductor layer may overlap the first electrode in a plan view.

According to an embodiment, the active layer may be disposed adjacent to the first electrode than to the second electrode in a plan view.

According to an embodiment, the first electrode may not overlap the third electrode in a plan view, and the second electrode may overlap the third electrode in a plan view.

According to an embodiment, the at least one light emitting element may include a light emitting element overlapping the first electrode in a plan view, the third electrode may include a first area overlapping the light emitting element and a second area overlapping the second electrode in a plan view, and the first area and the second area may be spaced apart from each other.

According to an embodiment, the first electrode and the second electrode may be spaced apart by a first distance, the first electrode and the third electrode may be spaced apart by a second distance, and the first distance the first electrode and the second electrode may be greater than the second distance the first electrode and the third electrode.

According to an embodiment, a distal end portion of the third electrode may be spaced apart from the second electrode by a third distance, the first distance may be about 3 μm or more, and the third distance may be in a range of about 1 μm to about 2.5 μm.

According to an embodiment, display device may further include an insulating portion disposed on the substrate, the insulating portion and the third electrode being disposed on a same layer.

According to an embodiment, the first electrode may be disposed on the insulating portion, and a separation distance between the first electrode and the substrate and a separation distance between the second electrode and the substrate may be equal.

According to an embodiment, the third electrode may include a reflective material.

According to an embodiment, the display device may further include a connection pattern disposed on the substrate, the connection pattern and the third electrode being disposed and disposed on a same layer.

According to an embodiment, a separation distance between the first electrode and the substrate may be less than a separation distance between the second electrode and the substrate.

According to an embodiment, the display device may further include an insulating layer overlapping the first electrode and the second electrode in a plan view, the insulating layer may have a first thickness in an area overlapping the first electrode in a plan view, and a second thickness in an area overlapping the second electrode and the third electrode in a plan view, and the first thickness may be greater than the second thickness of the insulating layer.

According to an embodiment, a method of manufacturing a display device may include disposing a first electrode and a second electrode on a substrate; disposing a first electrode and a second electrode on the substrate; providing an ink including a solvent and a light emitting element in the solvent; and forming an electric field between the first electrode and the second electrode, the light emitting element may include a first semiconductor layer including a semiconductor of a first type; a second semiconductor layer including a semiconductor of a second type different from the first type; and an active layer disposed between the first semiconductor layer and the second semiconductor layer, the disposing of the first electrode and the second electrode may include electrically connecting the second electrode and the third electrode; and disposing at least a portion of the third electrode between the first electrode and the second electrode in a plan view.

According to an embodiment, the forming of the electric field may include outputting a first electrical signal from the first electrode; outputting a second electrical signal from the second electrode and the third electrode; and providing an alignment electric field to an area in which the light emitting element is disposed, and the alignment electric field may be based on the first electrical signal and the second electrical signal.

According to an embodiment, the third electrode may include a distal end portion based on the second electrode, and at least a portion of the second electrical signal may be provided from the distal end portion of the third electrode.

The disclosure is not limited to the above-described, and other objects will be clearly understood by those skilled in the art from the specification and the accompanying drawings.

According to an embodiment, a display device in which light emission efficiency is improved and a short defect between electrode configurations is prevented, and a method of manufacturing the same may be provided.

An effect of the disclosure is not limited to the above-described effects, and effects which are not described will be clearly understood by those skilled in the art from the specification and the accompanying drawings.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
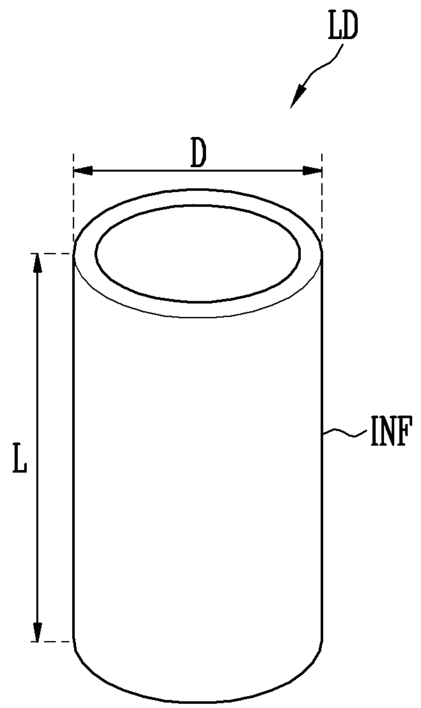
FIGS. 1 and 2 are schematic perspective view and schematic cross-sectional view illustrating a light emitting element according to an embodiment.

Embodiments described in the specification are for clearly describing the spirit and scope of the disclosure to those skilled in the art to which the disclosure pertains, however, the disclosure is not limited by the embodiments described in the specification, and the scope of the disclosure should be interpreted as including modifications or variations that do not depart from the spirit or scope of the disclosure.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The drawings attached to the specification are intended to readily describe the disclosure. Since shapes shown in the drawings may be exaggerated and displayed as necessary to help an understanding of the disclosure, the disclosure is not limited by the drawings.

In the specification, in case that it is determined that detailed description of a configuration or function related to the disclosure may obscure the subject matter of the disclosure, detailed description thereof may be omitted as necessary.

The disclosure relates to a display device and a method of manufacturing the same.

Hereinafter, a display device and a method of manufacturing the same according to an embodiment are described with reference to FIGS. 1 to 16.

Figure 2:
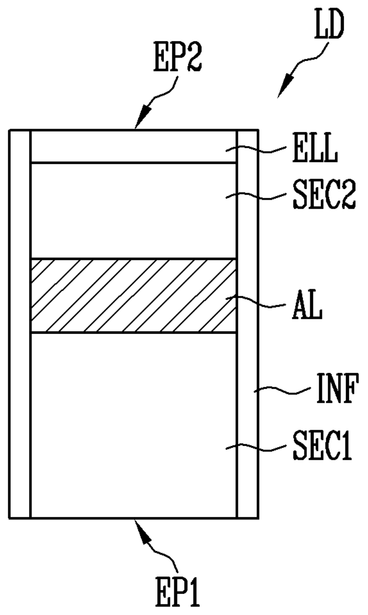

FIGS. 1 and 2 illustrate a light emitting element LD included in a display device according to an embodiment. FIGS. 1 and 2 are schematic perspective view and schematic cross-sectional view illustrating a light emitting element according to an embodiment. Although a column shape light emitting element LD is shown in FIGS. 1 and 2, a type and/or a shape of the light emitting element LD are/is not limited thereto. It is to be understood that the shapes disclosed herein may include shapes substantially identical or similar to the shapes.

Referring to FIGS. 1 and 2, the light emitting element LD may include a first semiconductor layer SEC1, a second semiconductor layer SEC2, and an active layer AL interposed between the first semiconductor layer SEC1 and the second semiconductor layer SEC2. For example, in case that an extension direction of the light emitting element LD is referred to as a length L direction, the light emitting element LD may include the first semiconductor layer SEC1, the active layer AL, and the second semiconductor layer SEC2 sequentially stacked each other along the length L direction. According to an embodiment, the light emitting element LD may further include an electrode layer ELL.

According to an embodiment, the light emitting element LD may be provided in a column shape extending in one direction or in a direction. The light emitting element LD may have a first end portion EP1 and a second end portion EP2. The first semiconductor layer SEC1 may be disposed adjacent to the first end portion EP1 of the light emitting element LD. The second semiconductor layer SEC2 may be disposed adjacent to the second end portion EP2 of the light emitting element LD.

According to an embodiment, the light emitting element LD may be a light emitting element manufactured in a column shape through an etching method or the like within the spirit and the scope of the disclosure. The column shape may encompass a rod-like shape (for example, an aspect ratio is greater than 1) or a bar-like shape that is long in the length L direction, such as a circular column or a polygonal column, and a shape of a cross section thereof is not particularly limited. For example, a length L of the light emitting element LD may be greater than a diameter D (or a width of a cross section) thereof.

According to an embodiment, the light emitting element LD may have a size of a nano (nanometer) scale to a micro (micrometer) scale. For example, each light emitting element LD may have the diameter D (or width) and/or the length L of a range of the nano scale to the micro scale. However, the size of the light emitting element LD is not limited thereto, and the size of the light emitting element LD may be variously changed according to a design condition of various devices using a light emitting device using the light emitting element LD as a light source, for example, a display device.

The first semiconductor layer SEC1 may be a semiconductor layer of a first conductivity type. For example, the first semiconductor layer SEC1 may include an N-type semiconductor layer. For example, the first semiconductor layer SEC1 may include a semiconductor material of any one of InAlGaN, GaN, AlGaN, InGaN, AlN, and InN, and may include an N-type semiconductor layer doped with a first conductivity type dopant such as Si, Ge, and Sn. However, the material forming the first semiconductor layer SEC1 is not limited thereto, and other various materials may form the first semiconductor layer SEC1.

The active layer AL may be disposed on the first semiconductor layer SEC1. The active layer AL may be disposed between the first semiconductor layer SEC1 and the second semiconductor layer SEC2.

According to an embodiment, the active layer AL may include any one of AlGaInP, AlGaP, AlInGaN, InGaN, and AlGaN. For example, in case that the active layer AL intends to output red light, the active layer AL may include AlGaInP and/or InGaN. In case that the active layer AL intends to output green light or blue light, the active layer AL may include InGaN. However, the active layer AL is not limited to the above-described example.

According to an embodiment, the active layer AL may be formed in a single-quantum well or multi-quantum well structure.

The second semiconductor layer SEC2 may be disposed on the active layer AL and may include a semiconductor layer of a type different from that of the first semiconductor layer SEC1. For example, the second semiconductor layer SEC2 may include a P-type semiconductor layer. For example, the second semiconductor layer SEC2 may include at least one semiconductor material among InAlGaN, GaN, AlGaN, InGaN, AlN, and InN, and may include a P-type semiconductor layer doped with a second conductivity type dopant such as Mg and Be. However, the material forming the second semiconductor layer SEC2 is not limited thereto, and various other materials may form the second semiconductor layer SEC2.

According to an embodiment, a height of the first semiconductor layer SEC1 may be greater than a height of the second semiconductor layer SEC2.

The electrode layer ELL may be formed on the second semiconductor layer SEC2. The electrode layer ELL may include a metal or a metal oxide. According to an example, the electrode layer ELL may include at least one of Cr, Ti, Al, Au, Ni, ITO, IZO, ITZO, and an oxide or an alloy thereof.

In case that a voltage equal to or greater than a threshold voltage is applied to both ends of the light emitting element LD, an electron-hole pair may be combined in the active layer AL, and light may be emitted from the light emitting element LD. By controlling light emission of the light emitting element LD using this principle, the light emitting element LD may be used as a light source of various light emitting devices including a pixel of a display device.

According to an embodiment, the light emitting element LD may further include an insulating layer INF provided on a surface thereof. The insulating layer INF may be formed on the surface of the light emitting element LD to surround at least an outer surface of the active layer AL, and further surround one area or an area of the first and second semiconductor layers SEC1 and SEC2. According to an embodiment, the insulating layer INF may be a single layer or layers. For example, the insulating layer INF may include a first insulating layer including a first material and a second insulating layer including a second material different from the first material and disposed on the first insulating layer.

According to an embodiment, the insulating layer INF may expose both end portions of the light emitting element LD having different polarities. For example, the insulating layer INF may expose the electrode layer ELL adjacent to the second end portion EP2 of the light emitting element LD and the first semiconductor layer SEC1 adjacent to the first end portion EP1 of the light emitting element LD. For example, according to an embodiment, the insulating layer INF may expose a side portion of the first semiconductor layer SEC1 and the second semiconductor layer SEC2.

According to an embodiment, the insulating layer INF may include any one of silicon oxide ($SiO_x$), silicon nitride ($SiN_x$), silicon oxynitride ($SiO_xN_y$), aluminum oxide ($AlO_x$), and titanium oxide ($TiO_x$).

According to an embodiment, the insulating layer INF may prevent an electrical short that may occur in case that the active layer AL contacts a conductive material except for the first semiconductor layer SEC1 and the second semiconductor layer SEC2. The insulating layer INF may minimize a surface defect of the light emitting element LD, thereby improving a lifespan and efficiency of the light emitting element LD. In case that light emitting elements LD are provided and disposed adjacent to each other, the insulating layer INF may prevent a short that may occur between the light emitting elements LD.

The light emitting device including the above-described light emitting element LD may be used in various types of devices requiring a light source, including a display device. For example, the light emitting elements LD may be disposed in each pixel (refer to 'PXL' of FIG. 3) of a display panel (refer to 'PNL' of FIG. 3), and the light emitting elements LD may be used as a light source of each pixel PXL. However, an application field of the light emitting element LD is not limited to the above-described example. For example, the light emitting element LD may be used in other types of devices requiring a light source, such as a lighting device.

Figure 3:
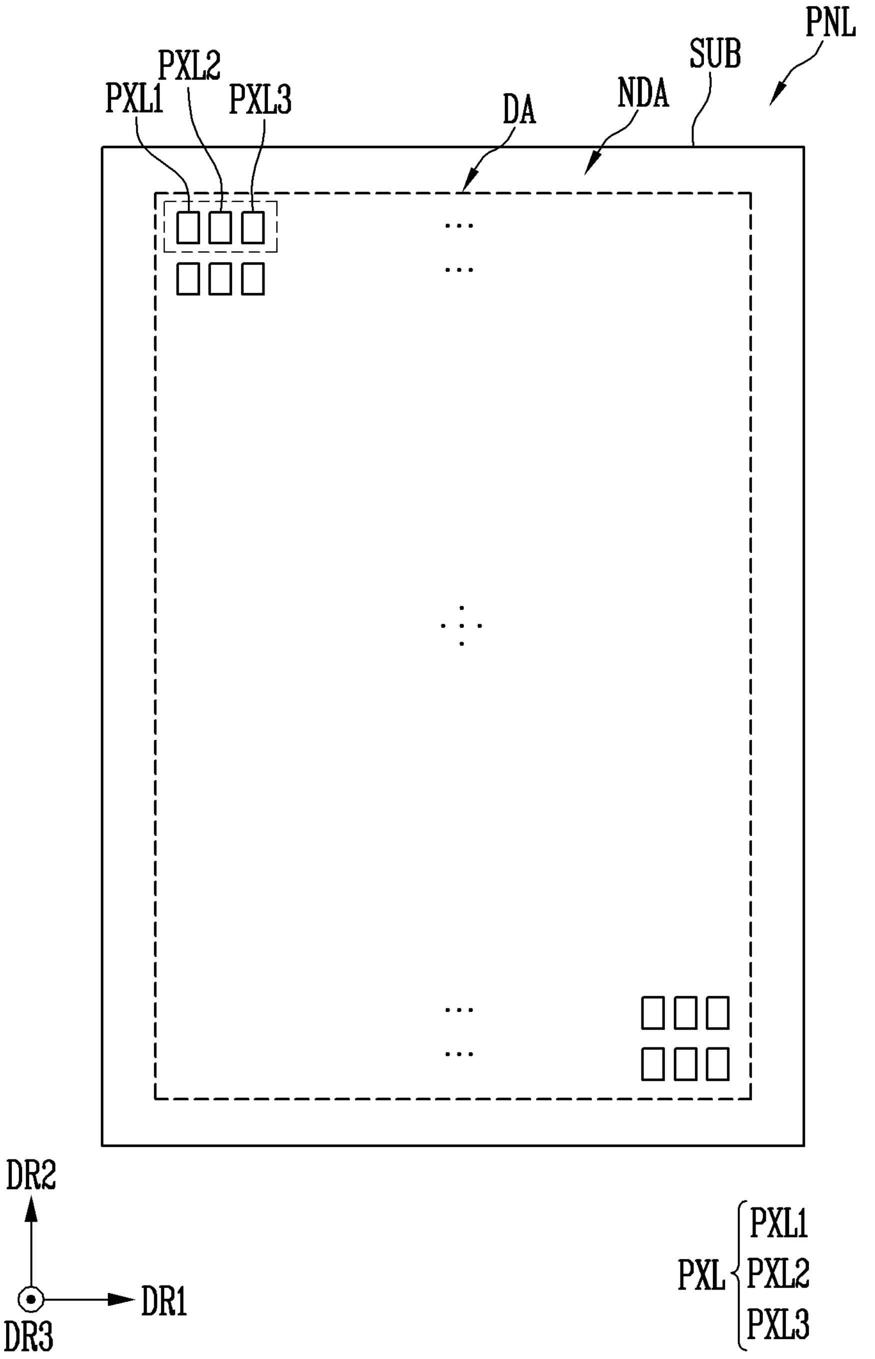
FIG. 3 is a schematic plan view illustrating a display device according to an embodiment.

FIG. 3 is a schematic plan view illustrating a display device according to an embodiment.

In FIG. 3, as an example of an electronic device that may use the light emitting element LD described with reference to FIGS. 1 and 2 as a light source, a display device, for example, the display panel PNL provided or disposed in the display device is described.

The display panel PNL may include the pixel PXL including the light emitting element LD. For convenience, in FIG. 3, a structure of the display panel PNL is briefly shown based on a display area DA. However, according to an embodiment, at least one driving circuit unit (for example, at least one of a scan driver and a data driver), lines, and/or pads, which are not shown may be further disposed on the display panel PNL.

Referring to FIG. 3, the display panel PNL may include a substrate SUB and the pixel PXL disposed on the substrate SUB. The pixel PXL may include a first pixel PXL1, a second pixel PXL2, and a third pixel PXL3.

The substrate SUB may form a base member of the display panel PNL, and may be a rigid or flexible substrate or film. According to an embodiment, the substrate SUB may be a rigid substrate formed of glass or tempered glass, a flexible substrate (or thin film) of a plastic or metal material, or at least one insulating layer. However, a material and/or a physical property of the substrate SUB are/is not particularly limited.

The display panel PNL may include the display area DA and a non-display area NDA. The non-display area NDA may mean an area except for the display area DA.

The display area DA may mean an area in which the pixel PXL is disposed. The non-display area NDA may mean an area in which the pixel PXL is not disposed. Various lines, pads, and/or a built-in circuit unit connected to the pixel PXL of the display area DA may be disposed in the non-display area NDA. The pixels PXL may be regularly arranged or disposed according to a stripe or PENTILE™ arrangement structure. However, the arrangement structure of the pixels PXL is not limited thereto, and the pixels PXL may be arranged or disposed in the display area DA in various structures and/or methods.

According to an embodiment, two or more types of pixels PXL emitting light of different colors may be disposed in the display area DA. For example, in the display area DA, the first pixel PXL1 emitting light of a first color, the second pixel PXL2 emitting light of a second color, and the third pixel PXL3 emitting light of a third color may be arranged or disposed.

According to an embodiment, at least one of the first to third pixels PXL1, PXL2, and PXL3 disposed adjacent to each other may form one pixel unit to emit light of various colors. For example, each of the first to third pixels PXL1, PXL2, and PXL3 may be a sub pixel emitting light of a given color. For example, the first pixel PXL1 may be a red pixel emitting red light, the second pixel PXL2 may be a green pixel emitting green light, and the third pixel PXL3 may be a blue pixel emitting blue light. However, the color, type, number, and/or the like of the pixels PXL forming each pixel unit are/is not limited to a given example.

The pixel PXL may include at least one light source. The light source may be driven by a control signal (for example, a scan signal and a data signal) and power. According to an embodiment, the light source may be the light emitting element LD described above with reference to FIGS. 1 and 2.

According to an embodiment, the pixel PXL may be an active pixel. However, the types, structures, and/or driving methods of the pixels PXL applicable to the display device are not particularly limited. For example, each pixel PXL may be c a pixel of a passive or active type light emitting display device having various structures and/or driving methods.

Figure 4:
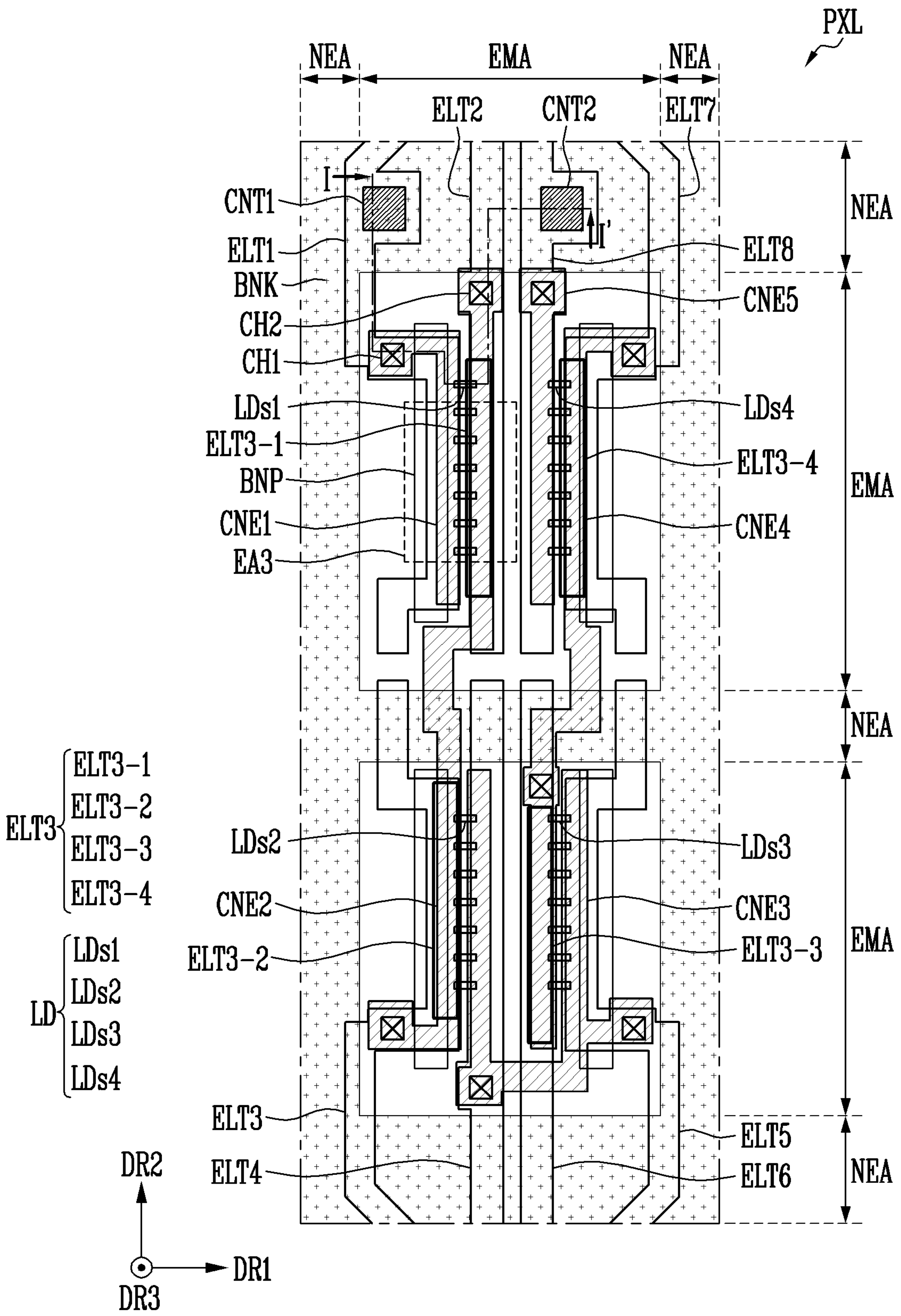
FIG. 4 is a schematic plan view of a pixel according to an embodiment.

FIG. 4 is a schematic plan view of a pixel according to an embodiment. The pixel PXL shown in FIG. 4 may be any one of the first pixel PXL1, the second pixel PXL2, and the third pixel PXL3 described above with reference to FIG. 3.

Referring to FIG. 4, the pixel PXL may include first to eighth electrodes ELT1 to ELT8, a third electrode ELT3, light emitting elements LD, a bank BNK, a bank pattern BNP, and first to fifth contact electrodes CNE1 to CNE5. According to an embodiment, the light emitting elements LD may include first to fourth light emitting elements LDs1 to LDs4. The third electrode ELT3 may include a (3-1)-th electrode ELT3-1, a (3-2)-th electrode ELT3-2, a (3-3)-th electrode ELT3-3, and a (3-4)-th electrode ELT3-4. According to an example, the third electrode ELT3 may be referred to as a slip electrode.

The light emitting elements LD may be disposed in an emission area EMA. According to an embodiment, the emission area EMA may mean an area from which light is emitted. The emission area EMA may be provided in a form surrounded by the bank BNK. The emission area EMA may mean an area in which the bank BNK is not disposed. The non-emission area NEA may mean an area from which light is not emitted. The non-emission area NEA may mean an area in which the bank BNK may be arranged or disposed.

According to an embodiment, the first light emitting element LDs1 may be disposed between the first electrode ELT1 and the second electrode ELT2. The first light emitting element LDs1 may be disposed between the (3-1)-th electrode ELT3-1 and the first electrode ELT1. The first light emitting elements LDs1 may be arranged or disposed along the second direction DR2 between the (3-1)-th electrode ELT3-1 and the first electrode ELT1 in a plan view.

According to an embodiment, the (3-1)-th electrode ELT3-1 may have a shape extending along the second direction DR2. At least a portion of the (3-1)-th electrode ELT3-1 may be disposed between the first electrode ELT1 and the second electrode ELT2 in a plan view. The (3-1)-th electrode ELT3-1 may be spaced apart from the first electrode ELT1 along the first direction DR1. The (3-1)-th electrode ELT3-1 and the first electrode ELT1 may define a slip area in which the first light emitting element LDs1 are disposed. The first direction DR1 and the second direction DR2 may cross or intersect each other.

According to an embodiment, the second light emitting element LDs2 may be disposed between the third electrode ELT3 and the fourth electrode ELT4. The second light emitting element LDs2 may be disposed between the (3-2)-th electrode ELT3-2 and the fourth electrode ELT4. The second light emitting elements LDs2 may be arranged or disposed along the second direction DR2 between the (3-2)-th electrode ELT3-2 and the fourth electrode ELT4 in a plan view.

According to an embodiment, the (3-2)-th electrode ELT3-2 may have a shape extending along the second direction DR2. At least a portion of the (3-2)-th electrode ELT3-2 may be disposed between the third electrode ELT3 and the fourth electrode ELT4 in a plan view. The (3-2)-th electrode ELT3-2 may be spaced apart from the fourth electrode ELT4 along the first direction DR1. The (3-2)-th electrode ELT3-2 and the fourth electrode ELT4 may define a slip area in which the second light emitting element LDs2 is disposed.

According to an embodiment, the third light emitting element LDs3 may be disposed between the fifth electrode ELT5 and the sixth electrode ELT6. The third light emitting element LDs3 may be disposed between the (3-3)-th electrode ELT3-3 and the fifth electrode ELT5. The third light emitting element LDs3 may be arranged or disposed along the second direction DR2 between the (3-3)-th electrode ELT3-3 and the fifth electrode ELT5 in a plan view.

According to an embodiment, the (3-3)-th electrode ELT3-3 may have a shape extending along the second direction DR2. At least a portion of the (3-3)-th electrode ELT3-3 may be disposed between the fifth electrode ELT5 and the sixth electrode ELT6 in a plan view. The (3-3)-th electrode ELT3-3 may be spaced apart from the fifth electrode ELT5 along the first direction DR1. The (3-3)-th electrode ELT3-3 and the fifth electrode ELT5 may define a slip area in which the third light emitting element LDs3 is disposed.

According to an embodiment, the fourth light emitting element LDs4 may be disposed between the seventh electrode ELT7 and the eighth electrode ELT8. The fourth light emitting element LDs4 may be disposed between the (3-4)-th electrode ELT3-4 and the eighth electrode ELT8. The fourth light emitting element LDs4 may be arranged or disposed along the second direction DR2 between the (3-4)-th electrode ELT3-4 and the eighth electrode ELT8 in a plan view.

According to an embodiment, the (3-4)-th electrode ELT3-4 may have a shape extending along the second direction DR2. At least a portion of the (3-4)-th electrode ELT3-4 may be disposed between the seventh electrode ELT7 and the eighth electrode ELT8 in a plan view. The (3-4)-th electrode ELT3-4 may be spaced apart from the eighth electrode ELT8 along the first direction DR1. The (3-4)-th electrode ELT3-4 and the eighth electrode ELT8 may define a slip area in which the fourth light emitting element LDs4 is disposed.

According to an embodiment, a pair of electrodes forming each series stage among the first to eighth electrodes ELT1 to ELT8 may be disposed adjacent to an area in which the light emitting element LD may be arranged or disposed. Each of the first to eighth electrodes ELT1 to ELT8 may extend along the second direction DR2 and may be disposed to be spaced apart from each other along the first direction DR1.

According to an embodiment, at least a portion of each of the first to eighth electrodes ELT1 to ELT8 may be arranged or disposed on the bank pattern BNP. For example, the first electrode ELT1 and the second electrode ELT2 may be disposed on the bank pattern BNP. The first electrode ELT1 and the second electrode ELT2 disposed on the bank pattern BNP may reflect the light emitted from the light emitting element LD, and thus light emission efficiency of the pixel PXL may be improved.

According to an embodiment, at least a portion of the light emitting element LD may overlap at least a portion of the first to eighth electrodes ELT1 to ELT8, and thus light emission efficiency may be improved. For example, the active layer AL of the first light emitting element LDs1 may overlap the first electrode ELT1, and thus light emission efficiency may be improved. A detailed description thereof is described with reference to FIGS. 5 and 8.

According to an embodiment, the first to eighth electrodes ELT1 to ELT8 may be a pixel electrode of each pixel PXL. After a portion of any one of the first to eighth electrodes ELT1 to ELT8 is formed as an alignment line, the portion may be disconnected between the adjacent pixels PXL and/or between the emission areas EMA of each pixel PXL and may be divided into each pixel electrode.

According to an embodiment, the first to eighth electrodes ELT1 to ELT8 may be electrically connected to the light emitting element LD through contact electrodes (for example, the first to fifth contact electrodes CNE1 to CNE5).

According to an embodiment, the first light emitting element LDs1, the second light emitting element LDs2, the third light emitting element LDs3, and the fourth light emitting element LDs4 may be connected in series.

The first contact electrode CNE1 may be disposed on the first light emitting element LDs1 of a first series stage and the first electrode ELT1, and may connect the first light emitting element LDs1 of the first series stage to the first electrode ELT1.

The second contact electrode CNE2 may be disposed on the first light emitting element LDs1 of the first series stage and the second electrode ELT2, and may connect the first light emitting element LDs1 of the first series stage to the second electrode ELT2. The second contact electrode CNE2 may be disposed on the second light emitting element LDs2 of a second series stage and the third electrode ELT3, and may connect the second light emitting element LDs2 of the second series stage to the third electrode ELT3.

The third contact electrode CNE3 may be disposed on the second light emitting element LDs2 of the second series stage and the fourth electrode ELT4, and may connect the second light emitting element LDs2 of the second series stage to the fourth electrode ELT4. The third contact electrode CNE3 may be disposed on the third light emitting element LDs3 of a third series stage and the fifth electrode ELT5, and may connect the third light emitting element LDs3 of the third series stage to the fifth electrode ELT5.

The fourth contact electrode CNE4 may be disposed on the third light emitting element LDs3 of the third series stage and the sixth electrode ELT6, and may connect the third light emitting element LDs3 of the third series stage to the sixth electrode ELT6. The fourth contact electrode CNE4 may be disposed on the fourth light emitting element LDs4 of a fourth series stage and the seventh electrode ELT7, and may connect the fourth light emitting element LDs4 of the fourth series stage to the seventh electrode ELT7.

The fifth contact electrode CNE5 may be disposed on the fourth light emitting element LDs4 of the fourth series stage and the eighth electrode ELT8, and may connect the fourth light emitting element LDs4 of the fourth series stage to the eighth electrode ELT8.

In FIG. 4, a structure in which the first to fourth light emitting elements LDs1 to LDs4 are arranged or disposed in series is described, but the disclosure is not limited thereto. The structure of the pixel PXL according to an embodiment is not limited to the above-described example, and the pixel PXL including various electrode connection structures may be provided according to an embodiment.

Figure 5:
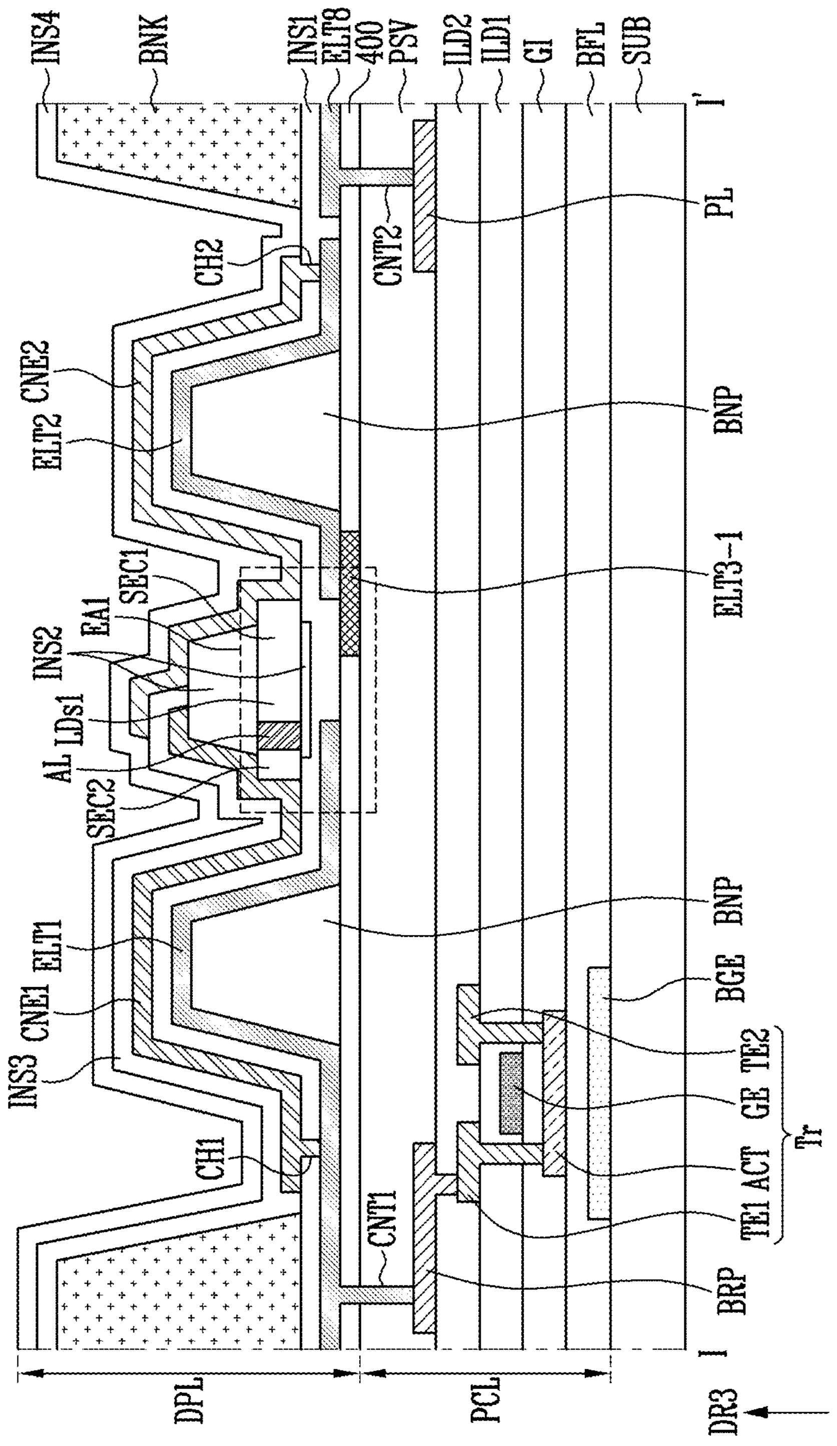
FIGS. 5, 6 and 7 are schematic cross-sectional views taken along line I~I' of FIG. 4.

FIG. 5 is a schematic cross-sectional view taken along line I~I' of FIG. 4.

Referring to FIG. 5, a pixel PXL according to an embodiment may include a substrate SUB, a pixel circuit portion PCL, and a display element portion DPL. In FIG. 5, for convenience of description, the disclosure is described based on the first light emitting element LDs1 among the light emitting elements LD. The disclosure is described based on the (3-1)-th electrode ELT3-1 among the third electrodes ELT3. The disclosure is described based on the first electrode ELT1, the second electrode ELT2, and the eighth electrode ELT8 among the first to eighth electrodes ELT1 to ELT8.

The substrate SUB may form a base surface of the pixel PXL. The substrate SUB may be a rigid or flexible substrate. According to an example, the substrate SUB may include a rigid material or a flexible material, but is not limited to a given example.

The pixel circuit portion PCL may include a buffer layer BFL, a back gate electrode BGE, a transistor Tr, a gate insulating layer GI, a first interlayer insulating layer ILD1, a second interlayer insulating layer ILD2, a bridge pattern BRP, a power line PL, a first contact portion CNT1, a second contact portion CNT2, and a protective layer PSV.

The buffer layer BFL may be disposed on the substrate SUB. The buffer layer BFL may prevent an impurity from diffusing from an outside. The buffer layer BFL may include at least one of a metal oxides such as silicon nitride ($SiN_x$), silicon oxide ($SiO_x$), silicon oxynitride ($SiO_xN_y$), and aluminum oxide ($AlO_x$).

The back gate electrode BGE may be positioned or disposed on the substrate SUB. The back gate electrode BGE may overlap a gate electrode GE in a plan view.

The transistor Tr may be a thin film transistor. According to an embodiment, the transistor Tr may be a driving transistor. The transistor Tr may include an active layer ACT, a first transistor electrode TE1, a second transistor electrode TE2, and the gate electrode GE.

The active layer ACT may mean a semiconductor layer. The active layer ACT may be disposed on the buffer layer BFL. The active layer ACT may include at least one of polysilicon, amorphous silicon, and an oxide semiconductor.

According to an embodiment, the active layer ACT may include a first contact region that contacts the first transistor electrode TE1, and a second contact region that contacts the second transistor electrode TE2. The first contact region and the second contact region may be semiconductor patterns doped with impurities. A region between the first contact region and the second contact region may be a channel region. The channel region may be an intrinsic semiconductor pattern that is not doped with an impurity.

The gate electrode GE may be disposed on the gate insulating layer GI. A position of the gate electrode GE may correspond to a position of the channel region of the active layer ACT. For example, the gate electrode GE may be disposed on the channel region of the active layer ACT with the gate insulating layer GI interposed therebetween.

The gate insulating layer GI may be disposed on the active layer ACT. The gate insulating layer GI may include an inorganic material. According to an example, the gate insulating layer GI may include at least one of silicon nitride ($SiN_x$), silicon oxide ($SiO_x$), silicon oxynitride ($SiO_xN_y$), and aluminum oxide ($AlO_x$). According to an embodiment, the gate insulating layer GI may include an organic material.

The first interlayer insulating layer ILD1 may be disposed on the gate electrode GE. Similarly to the gate insulating layer GI, the first interlayer insulating layer ILD1 may include at least one of silicon nitride ($SiN_x$), silicon oxide ($SiO_x$), silicon oxynitride ($SiO_xN_y$), and aluminum oxide ($AlO_x$).

The first transistor electrode TE1 and the second transistor electrode TE2 may be disposed on the first interlayer insulating layer ILD1. The first transistor electrode TE1 may pass through the gate insulating layer GI and the first interlayer insulating layer ILD1 to contact the first contact region of the active layer ACT, and the second transistor electrode TE2 may pass through the gate insulating layer GI and the first interlayer insulating layer ILD1 to contact the second contact region of the active layer ACT. According to an example, the first transistor electrode TE1 may be a source electrode, and the second transistor electrode TE2 may be a drain electrode, but are not limited thereto.

The second interlayer insulating layer ILD2 may be disposed on the first transistor electrode TE1 and the second transistor electrode TE2. Similarly, to the first interlayer insulating layer ILD1 and the gate insulating layer GI, the second interlayer insulating layer ILD2 may include an inorganic material. The inorganic material may include at least one of materials of the first interlayer insulating layer ILD1 and the gate insulating layer GI, for example, silicon nitride ($SiN_x$), silicon oxide ($SiO_x$), silicon oxynitride ($SiO_xN_y$), and aluminum oxide ($AlO_x$). According to an embodiment, the second interlayer insulating layer ILD2 may include an organic material.

The bridge pattern BRP may be disposed on the second interlayer insulating layer ILD2. The bridge pattern BRP may be connected to the first transistor electrode TE1 through a contact hole passing through the second interlayer insulating layer ILD2.

The power line PL may be disposed on the second interlayer insulating layer ILD2. The power line PL may be connected to the eighth electrode ELT8 through the second contact portion CNT2. The power line PL may supply power to the fourth light emitting element LDs4 described above with reference to FIG. 4.

The protective layer PSV may be disposed on the second interlayer insulating layer ILD2. The protective layer PSV may cover or overlap the bridge pattern BRP and the power line PL. The protective layer PSV may be provided in a form including an organic insulating layer, an inorganic insulating layer, or the organic insulating layer disposed on the inorganic insulating layer, but is not limited thereto.

The first contact portion CNT1 connected to one area or an area of the bridge pattern BRP and the second contact portion CNT2 connected to one area, or an area of the power line PL may be formed in the protective layer PSV.

The display element portion DPL may be disposed on the pixel circuit portion PCL. The display element portion DPL may include an insulating portion 400, the (3-1)-th electrode ELT3-1, the bank pattern BNP, the first electrode ELT1, the second electrode ELT2, the eighth electrode ELT8, a first insulating layer INS1, a second insulating layer INS2, a third insulating layer INS3, a fourth insulating layer INS4, the first light emitting element LDs1, a first contact hole CH1, a second contact hole CH2, the first contact electrode CNE1, the second contact electrode CNE2, and the bank BNK.

The insulating portion 400 may be disposed on the protective layer PSV. The insulating portion 400 may include an organic material and/or an inorganic material, but is not limited to a given example. At least a portion of the first contact portion CNT1 and the second contact portion CNT2 may be formed in the insulating portion 400.

According to an embodiment, the insulating portion 400 may be disposed on the same layer as the (3-1)-th electrode ELT3-1. For example, the insulating portion 400 may be disposed in an area where the (3-1)-th electrode ELT3-1 is not disposed, and may not be positioned or may be formed thinly in an area where the (3-1)-th electrode ELT3-1 is disposed. Accordingly, the insulating portion 400 may prevent the first electrode ELT1 and the second electrode ELT2 formed on the insulating portion 400 from being positioned at different heights.

The (3-1)-th electrode ELT3-1 may be disposed on the protective layer PSV. The (3-1)-th electrode ELT3-1 may be disposed between adjacent bank patterns BNP. At least a portion of the (3-1)-th electrode ELT3-1 may be disposed between the first electrode ELT1 and the second electrode ELT2 in a plan view.

According to an embodiment, at least a portion of the (3-1)-th electrode ELT3-1 may be disposed under or below the second electrode ELT2. At least a portion of the (3-1)-th electrode ELT3-1 may be positioned between the second electrode ELT2 and the substrate SUB. According to an embodiment, the (3-1)-th electrode ELT3-1 may be disposed on the same layer as the insulating portion 400.

According to an embodiment, the (3-1)-th electrode ELT3-1 may include a transparent conductive material. According to an example, the (3-1)-th electrode ELT3-1 may include any one of indium tin oxide (ITO), indium zinc oxide (IZO), zinc oxide ($ZnO_x$), and indium tin zinc oxide (ITZO). ZnO may include ZnO and/or $ZnO_2$. However, the disclosure is not limited thereto and according to an embodiment, the (3-1)-th electrode ELT3-1 may include a reflective material. According to an example, the (3-1)-th electrode ELT3-1 may include at least one of Ag, Mg, Al, Pt, Pd, Au, Ni, Nd, Ir, Cr, Li, Ca, LiF/Ca, LiF/Al, Mo, Ti, and Cu. In case that the (3-1)-th electrode ELT3-1 includes the reflective material, the (3-1)-th electrode ELT3-1 disposed under or below the first light emitting element LDs1 may reflect light to improve light emission efficiency.

According to an embodiment, the (3-1)-th electrode ELT3-1 may be electrically connected to the second electrode ELT2. For example, the (3-1)-th electrode ELT3-1 and the second electrode ELT2 may physically contact and be electrically connected to each other. (Refer to FIG. 5) According to another example, the insulating portion 400 may be interposed between the (3-1)-th electrode ELT3-1 and the second electrode ELT2, and the (3-1)-th electrode ELT3-1 and the second electrode ELT2 may be electrically connected to each other through a given contact hole formed in the insulating portion 400. (Refer to FIG. 6)

Figure 6:
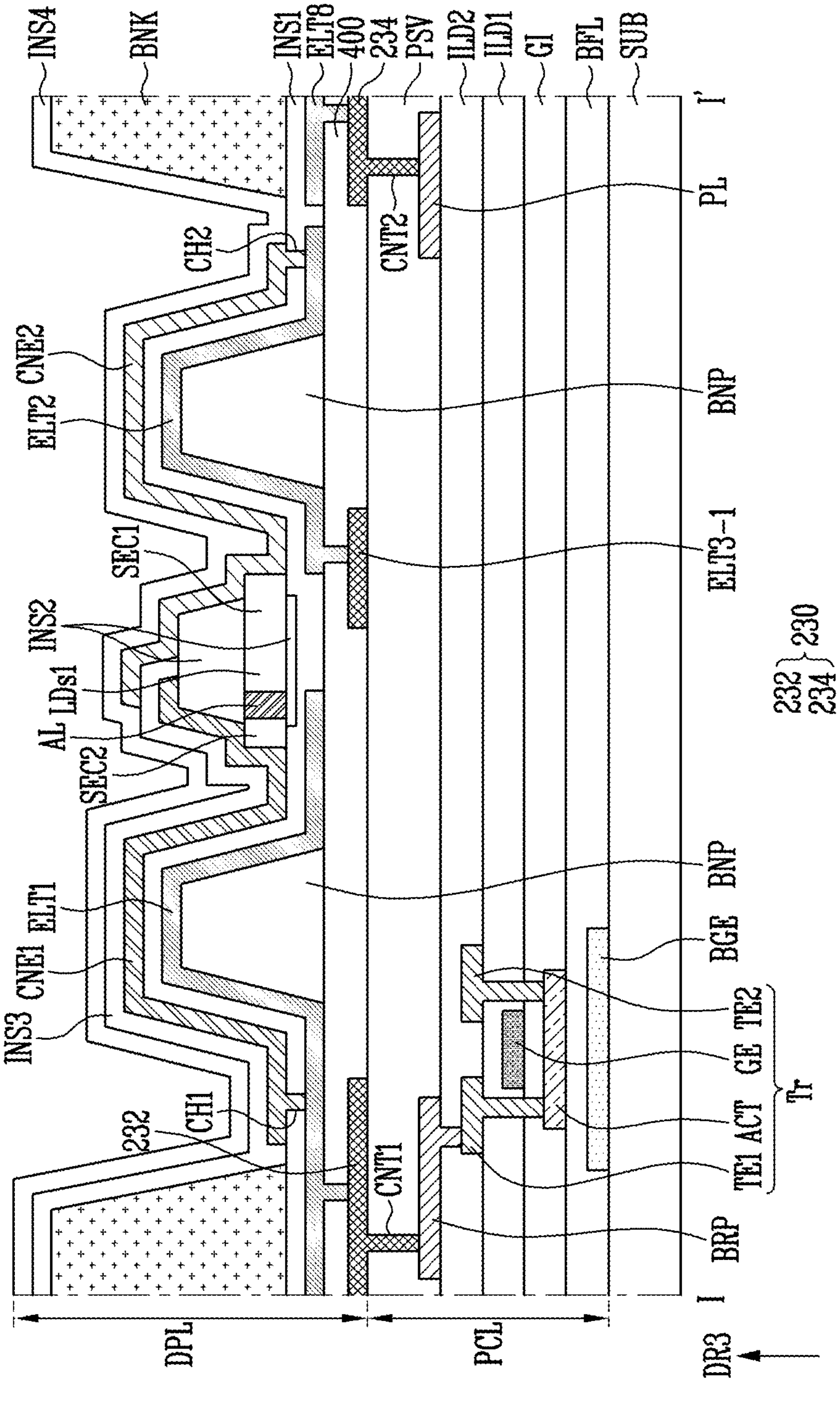

Referring to FIG. 6, according to an embodiment, the pixel PXL may further include a connection pattern 230. FIG. 6 may be a schematic cross-sectional view illustrating the connection pattern included in the pixel. FIG. 6 is a schematic cross-sectional view taken along line I~I' of FIG. 4. Differently from the pixel PXL shown in FIG. 5, the pixel PXL according to FIG. 6 may further include the connection pattern 230.

According to an embodiment, the connection pattern 230 may include a first connection pattern 232 and a second connection pattern 234. The first connection pattern 232 may be electrically connected to the first contact portion CNT1, and the second connection pattern 234 may be electrically connected to the second contact portion CNT2.

According to an embodiment, the connection pattern 230 may be formed at the same time as the (3-1)-th electrode ELT3-1. The connection pattern 230 may be patterned together with the (3-1)-th electrode ELT3-1 in a single process.

According to an embodiment, contact holes may be formed in the insulating portion 400, and the first connection pattern 232 may be electrically connected to the first electrode ELT1 through any one of the contact holes. The second connection pattern 234 may be electrically connected to the second electrode ELT2 through another of the contact holes. The (3-1)-th electrode ELT3-1 may be electrically connected through another of the contact holes.

Figure 7:
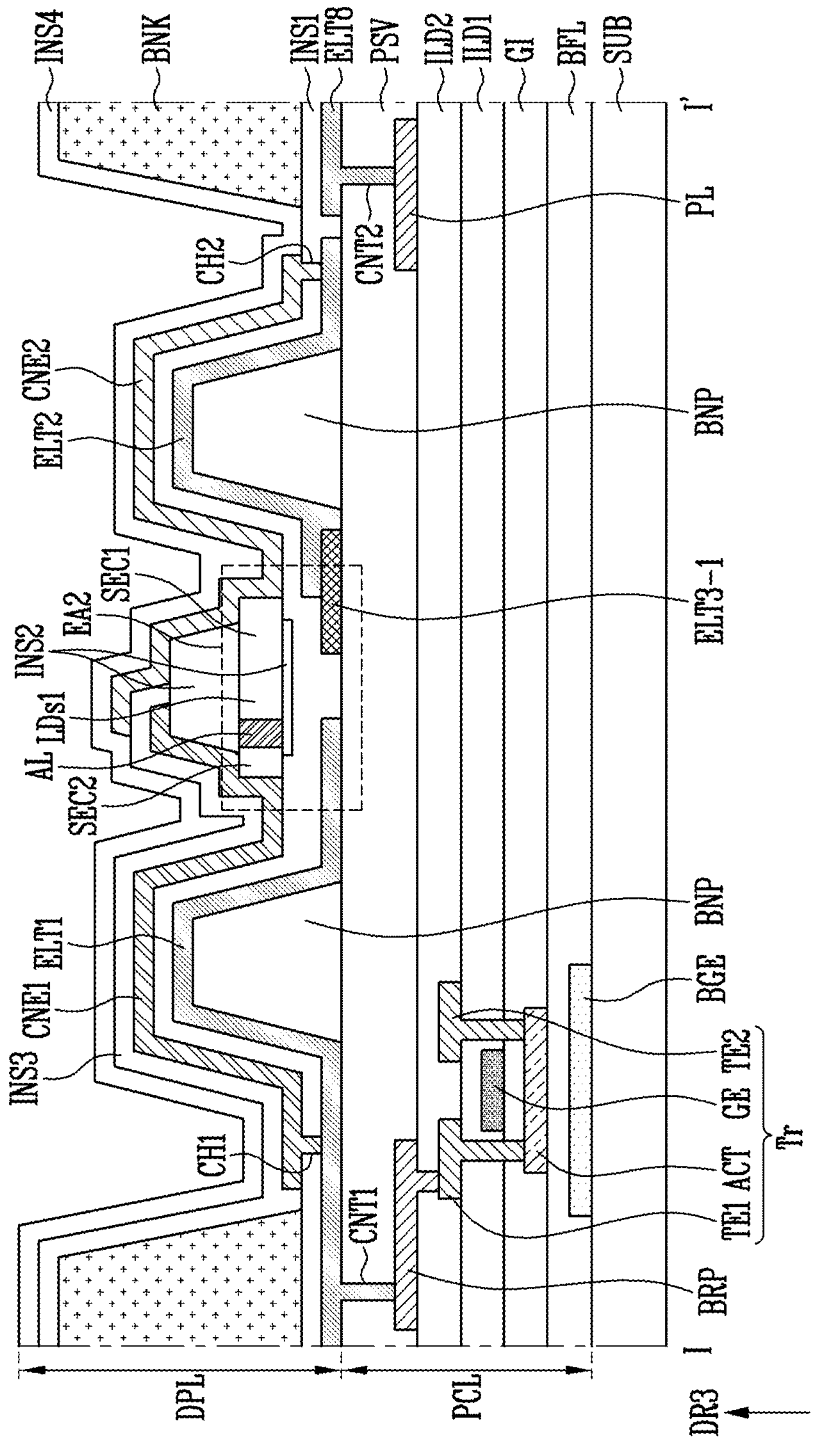

Referring to FIG. 7, according to an embodiment, the pixel PXL may not include the insulating portion 400. FIG. 7 may be a schematic cross-sectional view illustrating a structure in which an insulating portion is not included in the pixel. FIG. 7 is a schematic cross-sectional view taken along line I~I' of FIG. 4. Differently from the pixel PXL of FIG. 5, the pixel PXL according to FIG. 7 does not include the insulating portion 400.

According to an embodiment, the insulating portion 400 described above with reference to FIG. 5 may not be disposed on the protective layer PSV. The (3-1)-th electrode ELT3-1 may be disposed on the protective layer PSV, and at least a portion of each of the first electrode ELT1 and the second electrode ELT2 may be disposed on the protective layer PSV.

According to an embodiment, the first electrode ELT1 may be electrically connected to the bridge pattern BRP through the first contact portion CNT1. The second electrode ELT2 may be electrically connected to the power line PL through the second contact portion CNT2.

According to an embodiment, the first electrode ELT1 and the second electrode ELT2 may be spaced apart from each other by different distances from the substrate SUB (or the protective layer PSV of the pixel circuit portion PCL). For example, the first electrode ELT1 may be disposed on the protective layer PSV, and the second electrode ELT2 may be disposed on the (3-1)-th electrode ELT3-1 disposed on the protective layer PSV.

Referring to FIG. 5 again, the pixel PXL according to an embodiment is described.

The first electrode ELT1, the second electrode ELT2, and the eighth electrode ELT8 may be disposed on the protective layer PSV. According to an embodiment, at least a portion of each of the first electrode ELT1 and the second electrode ELT2 may be disposed on the bank pattern BNP, and thus light emission efficiency of the first light emitting element LDs1 may be improved.

According to an embodiment, the first electrode ELT1 may be electrically connected to the bridge pattern BRP through the first contact portion CNT1, and first power may be supplied to the first electrode ELT1. Although not shown in FIG. 5, the second electrode ELT2 may be electrically connected to a given line, and second power different from the first power may be supplied to the second electrode ELT2. The eighth electrode ELT8 may be electrically connected to the power line PL through the second contact portion CNT2 to receive power.

According to an embodiment, at least a portion of the second electrode ELT2 may be disposed on the (3-1)-th electrode ELT3-1. The second electrode ELT2 may overlap the (3-1)-th electrode ELT3-1.

According to an embodiment, the second electrode ELT2 may contact at least a portion of the (3-1)-th electrode ELT3-1, and the second electrode ELT2 and the (3-1)-th electrode ELT3-1 may be electrically connected to each other. For example, according to an embodiment, although not shown in FIG. 5, an insulating layer may be interposed between the second electrode ELT2 and the (3-1)-th electrode ELT3-1, and the second electrode ELT2 and the (3-1)-th electrode ELT3-1 may be electrically connected through a contact hole formed in the insulating layer.

The first insulating layer INS1 may be disposed on at least a portion of each of the first electrode ELT1, the second electrode ELT2, the eighth electrode ELT8, and the (3-1)-th electrode ELT3-1. The first insulating layer INS1 may stabilize an electrical connection for the (3-1)-th electrode ELT3-1, the first electrode ELT1, the second electrode ELT2, and/or the eighth electrode ELT8, and attenuate an external influence. The first insulating layer INS1 may include an organic material and/or an inorganic material. For example, the first insulating layer INS1 may include any one of silicon oxide ($SiO_x$), silicon nitride ($SiN_x$), silicon oxynitride ($SiO_xN_y$), aluminum oxide ($AlO_x$), and titanium oxide ($TiO_x$), but is not limited thereto.

The first light emitting element LDs1 may be disposed on the first insulating layer INS1. The first light emitting element LDs1 may be arranged or disposed in a slip area defined by the first electrode ELT1, the second electrode ELT2, and the (3-1)-th electrode ELT3-1.

According to an embodiment, the first light emitting element LDs1 may be disposed so that the first end portion EP1 faces the second electrode ELT2, and the second end portion EP2 faces the first electrode ELT1. For example, the first semiconductor layer SEC1 of the first light emitting element LDs1 may be disposed adjacent or close to the second electrode ELT2, and the second semiconductor layer SEC2 of the first light emitting element LDs1 may be disposed adjacent or close to the first electrode ELT1. The active layer AL of the first light emitting element LDs1 may be disposed adjacent or close to the first electrode ELT1 compared to the second electrode ELT2.

According to an embodiment, at least a portion of the first light emitting element LDs1 may overlap the first electrode ELT1. For example, the active layer AL of the first light emitting element LDs1 may overlap the first electrode ELT1 in a plan view.

The second insulating layer INS2 may be disposed on the first light emitting element LDs1. The second insulating layer INS2 may overlap the active layer AL of the first light emitting element LDs1.

According to an embodiment, at least a portion of the second insulating layer INS2 may be provided on a rear surface of the first light emitting element LDs1 during a manufacturing process to fill at least a portion of a cavity (or groove) defined by a step difference of the first insulating layer INS1. According to an example, the second insulating layer INS2 may include any one of the materials described above with reference to the first insulating layer INS1, but is not limited to a given example.

The first contact electrode CNE1 may be disposed on the first insulating layer INS1. The first contact electrode CNE1 may be electrically connected to the first light emitting element LDs1. According to an embodiment, the first contact electrode CNE1 may be electrically connected to the first electrode ELT1 through the first contact hole CH1 formed in the first insulating layer INS1.

The second contact electrode CNE2 may be disposed on the first insulating layer INS1. The second contact electrode CNE2 may be electrically connected to the first light emitting element LDs1. According to an embodiment, the second contact electrode CNE2 may be electrically connected to the second electrode ELT2 through the second contact hole CH2 formed in the first insulating layer INS1.

The bank BNK may be a structure defining the emission area EMA of the pixel PXL. The bank BNK may have a shape protruding in a display direction (for example, a third direction DR3) of the display device (and/or the display panel PNL) according to an embodiment. The bank BNK may have a shape surrounding at least a portion of the first light emitting element LDs1. According to an embodiment, the bank BNK may include any one of an organic material or an inorganic material.

At least a portion of the third insulating layer INS3 may be disposed between the first contact electrode CNE1 and the second contact electrode CNE2 on the first light emitting element LDs1.

A portion of the third insulating layer INS3 may be disposed between the first contact electrode CNE1 and the second contact electrode CNE2 to prevent a short between the first contact electrode CNE1 and the second contact electrode CNE2. The third insulating layer INS3 may include any one of the materials described with reference to the first insulating layer INS1, but is not limited thereto.

The fourth insulating layer INS4 may cover or overlap the bank BNK, the first contact electrode CNE1, the second contact electrode CNE2, and the third insulating layer INS3. The fourth insulating layer INS4 may protect an individual configuration of the display element portion DPL from an external influence.

Although not shown in the drawings, according to an embodiment, a planarization layer may be further provided on the fourth insulating layer INS4. The planarization layer may alleviate a step difference generated by various configurations disposed thereunder, and an upper surface of the planarization layer may be generally flat. The planarization layer may include an organic insulating layer, but is not limited thereto, and may further include an inorganic insulating layer according to an embodiment.

According to an embodiment, a color conversion portion may be further included on the display element portion DPL. The color conversion portion may be a configuration to change a specific or given wavelength.

For example, the color conversion portion may include a first wavelength conversion pattern, a second wavelength conversion pattern, and a light transmission pattern. Here, the first wavelength conversion pattern may include a first color conversion particle (for example, a first quantum dot) that changes the light emitted from the first light emitting element LDs1 into light of a first color, the second wavelength conversion pattern may include a second color conversion particle (for example, a second quantum dot) that changes the light emitted from the first light emitting element LDs1 into light of a second color, and the light transmission pattern may transmit the light emitted from the first light emitting element LDs1. According to an embodiment, an area overlapping the first wavelength conversion pattern may be understood as a first sub pixel area, an area overlapping the second wavelength conversion pattern may be understood as a second sub pixel area, an area overlapping the light transmission pattern may be understood as a third sub pixel area, and thus a full-color image may be displayed.

Hereinafter, a detailed structure of the pixel PXL is described with reference to FIGS. 8 and 9.

Figure 8:
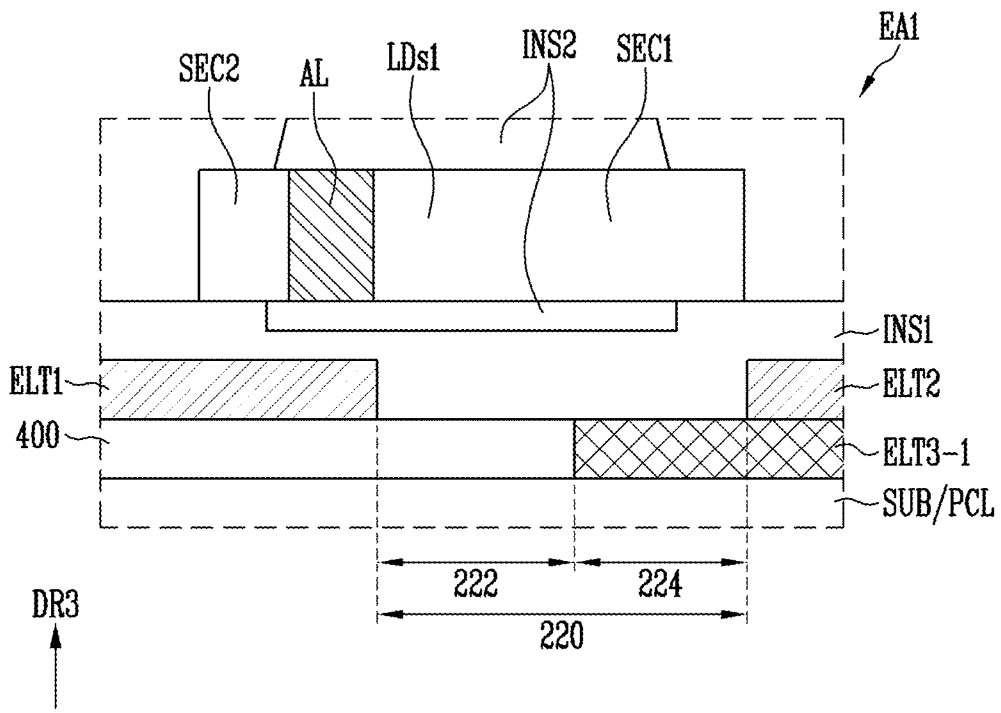
FIG. 8 is an enlarged view of an area EA1 of FIG. 5.
Figure 9:
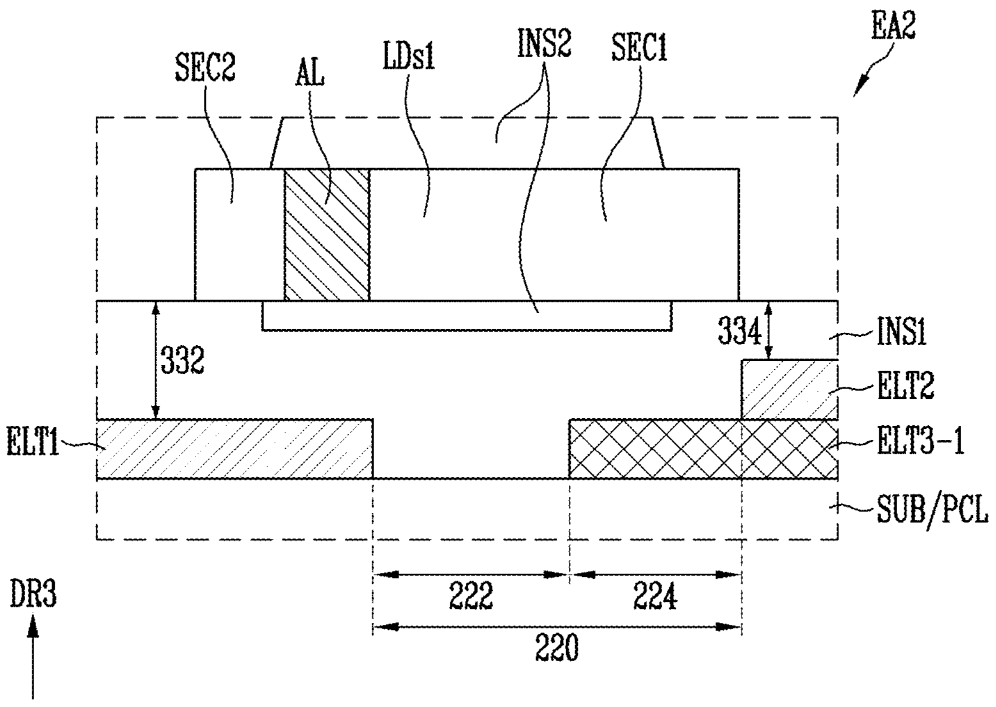
FIG. 9 is an enlarged view of an area EA2 of FIG. 7.

FIGS. 8 and 9 may be diagrams illustrating the third electrode ELT3 according to an embodiment. In a description related to FIGS. 8 and 9, the disclosure is described based on the (3-1)-th electrode ELT3-1 of the third electrode ELT3. In FIGS. 8 and 9, the first contact electrode CNE1 and the second contact electrode CNE2 are omitted for convenience of description.

First, a structure of the pixel PXL according to FIG. 5 is described with reference to FIG. 8. FIG. 8 is an enlarged view of an area EA1 of FIG. 5.

According to an embodiment, the first electrode ELT1 and the second electrode ELT2 may be spaced apart by a first distance 220. The first distance 220 may mean the shortest distance between the first electrode ELT1 and the second electrode ELT2 in a plan view. The first electrode ELT1 and the second electrode ELT2 may be spaced apart from each other, and thus an opening spaced apart by the first distance 220 along the first direction DR1 may be provided. The first distance 220 may be about 3 μm or more. For example, according to an embodiment, the first distance 220 may be about 3.5 μm or more.

According to an embodiment, the (3-1)-th electrode ELT3-1 and the first electrode ELT1 may not overlap each other in a plan view. The (3-1)-th electrode ELT3-1 and the first electrode ELT1 may be spaced apart from each other by a second distance 222. The second distance 222 may mean the shortest distance between the (3-1)-th electrode ELT3-1 and the first electrode ELT1 in a plan view. According to an embodiment, the second distance 222 may be less than the first distance 220.

According to an embodiment, the (3-1)-th electrode ELT3-1 and the first electrode ELT1 may be disposed on different layers. For example, the (3-1)-th electrode ELT3-1 may be disposed on the uppermost layer (for example, the protective layer PSV) of the pixel circuit portion PCL, and the first electrode ELT1 may be disposed on the insulating portion 400 disposed on the uppermost layer.

According to an embodiment, at least a portion of the (3-1)-th electrode ELT3-1 may overlap the second electrode ELT2. The (3-1)-th electrode ELT3-1 may include an area overlapping the second electrode ELT2 in a plan view. According to an embodiment, a contact surface may be formed in an area where the (3-1)-th electrode ELT3-1 and the second electrode ELT2 overlap, and the (3-1)-th electrode ELT3-1 and the second electrode ELT2 may be electrically connected to each other. However, although not shown in the drawings, according to an embodiment, the insulating portion 400 in which a given contact hole is formed between the second electrode ELT2 and the (3-1)-th electrode ELT3-1 may be interposed, and the second electrode ELT2 and the (3-1)-th electrode ELT3-1 may be electrically connected through the given contact hole.

According to an embodiment, at least a portion of the (3-1)-th electrode ELT3-1 may not overlap the second electrode ELT2. At this time, at least the portion of the (3-1)-th electrode ELT3-1 that does not overlap the second electrode ELT2 may overlap the first light emitting element LDs1.

According to an embodiment, a distal end portion of the (3-1)-th electrode ELT3-1, which is most spaced apart from the second electrode ELT2, and the second electrode ELT2 may be spaced apart by a third distances 224 along the first direction DR1 in a plan view. According to an embodiment, the first distance 220 may be equal to a sum of the second distance 222 and the third distance 224. The distal end portion may mean a partial area included in the (3-1)-th electrode ELT3-1, and may be defined based on a position of the second electrode ELT2.

According to an embodiment, the third distance 224 may be in a range of about 1 μm to about 2.5 μm. For example, the third distance 224 may be in a range of about 1 μm to about 2.0 μm.

According to an embodiment, the (3-1)-th electrode ELT3-1 and the first light emitting element LDs1 may overlap each other in a plan view. The second electrode ELT2 may not be disposed in the overlapping area between the (3-1)-th electrode ELT3-1 and the first light emitting element LDs1.

For example, the (3-1)-th electrode ELT3-1 may include a first area where the (3-1)-th electrode ELT3-1 and the first light emitting element LDs1 overlap and a second area where the (3-1)-th electrode ELT3-1 and the second electrode ELT2 overlap in a plan view.

Here, the first area and the second area may be spaced apart from each other and may not overlap each other. An area where all of the (3-1)-th electrode ELT3-1, the second electrode ELT2, and the first light emitting element LDs1 overlap may not be provided. According to an embodiment, the (3-1)-th electrode ELT3-1 may overlap the first semiconductor layer SEC1 of the first light emitting element LDs1 in a plan view. The (3-1)-th electrode ELT3-1 may not overlap the second semiconductor layer SEC2 of the first light emitting element LDs1 in a plan view.

According to an embodiment, the first electrode ELT1 may overlap the second semiconductor layer SEC2 of the first light emitting element LDs1 in a plan view. The first electrode ELT1 may overlap at least a portion of the active layer AL of the first light emitting element LDs1 in a plan view. The first electrode ELT1 may be disposed adjacent to the active layer AL than to the second electrode ELT2.

According to an embodiment, light due to combination between electron-hole in the active layer AL may be emitted, a height of the second semiconductor layer SEC2 may be provided to be less than a height of the first semiconductor layer SEC1, and thus a high amount of light may be output through the second semiconductor layer SEC2 (for example, the second end portion EP2 of the second semiconductor layer SEC2). At this time, at least a portion of each of the second semiconductor layer SEC2 and the active layer AL may overlap the first electrode ELT1 having reflectivity, and thus light emission efficiency may be improved.

Here, the height of the first semiconductor layer SEC1 and the second semiconductor layer SEC2 as understood herein may mean a height in a direction from the first semiconductor layer SEC1 to the second semiconductor layer SEC2. For example, the height of the first semiconductor layer SEC1 and the second semiconductor layer SEC2 may be a height defined along the first direction DR1 in FIG. 8. For example, the height of the first semiconductor layer SEC1 and the second semiconductor layer SEC2 may be defined by a length direction of the first light emitting element LDs1.

According to an embodiment, the first light emitting element LDs1 may be arranged or disposed between the first electrode ELT1 and the second electrode ELT2 functioning as an alignment line, and may be arranged or disposed based on an electric field generated by providing an electrical signal to the first electrode ELT1 and the second electrode ELT2.

According to an embodiment, in case that the first light emitting elements LDs1 are arranged or disposed, the first semiconductor layer SEC1 may face the second electrode ELT2, and the second semiconductor layer SEC2 may face the first electrode ELT1.

Experimentally, in case that an electric field is formed only between the first electrode ELT1 and the second electrode ELT2, an area where the first light emitting element LDs1 overlaps the first electrode ELT1 and/or the second electrode ELT2 may be difficult to be provided largely.

Experimentally, in a case of manufacturing by narrowing a distance between the first electrode ELT1 and the second electrode ELT2 in order to expand the overlapping area (for example, in a case where the first distance 220 of FIG. 7 is desired to be reduced), a risk of occurrence of a short defect between the first electrode ELT1 and the second electrode ELT2 may increase.

However, according to an embodiment, in case that an electric field is formed between the alignment line (for example, the first electrode ELT1 and the second electrode ELT2) and the first light emitting elements LDs1 are arranged or disposed, the electrical signal provided from the second electrode ELT2 may also be output through the (3-1)-th electrode ELT3-1. Accordingly, the electric field for alignment of the first light emitting element LDs1 may be formed by the first electrode ELT1, the second electrode ELT2, and the (3-1)-th electrode ELT3-1.

For example, a first electrical signal may be provided from the first electrode ELT1, and a second electrical signal provided from the second electrode ELT2 may be provided through the second electrode ELT2 and the (3-1)-th electrode ELT3-1. The first electrical signal and the second electrical signal may be organically connected or coupled and provided as the electric field, and thus the first light emitting elements LDs1 may be aligned in a given direction. At this time, the second electrical signal may be affected by at least a portion of the (3-1)-th electrode ELT3-1 protruding from the second electrode ELT2 along the first direction DR1. Accordingly, an effect that a separation distance between the electrodes defining the electric field for the alignment of the first light emitting element LDs1 is reduced by the (3-1)-th electrode ELT3-1 may be provided without excessively reducing the first distance 220 between the first electrode ELT1 and the second electrode ELT2.

The first electrode ELT1, which may be an alignment line that does not overlap the (3-1)-th electrode ELT3-1, may be disposed adjacent to the active layer AL of the first light emitting element LDs1 compared to the second electrode ELT2 as described above. According to an embodiment, since the first light emitting elements LDs1 are arranged or disposed based on the electric field defined by the first electrode ELT1, the second electrode ELT2, and the (3-1)-th electrode ELT3-1, the first light emitting element LDs1 may be positioned adjacent to the first electrode ELT1 than to the second electrode ELT2 in a plan view. Since the active layer AL is disposed adjacent to the first electrode ELT1 than to the second electrode ELT2, the light emission efficiency may be further improved. For example, the second semiconductor layer SEC2 may have a height lower than that of the first semiconductor layer SEC1, and the light emitted from the active layer AL may have a higher amount of light. Here, the heights of each of the first semiconductor layer SEC1 and the second semiconductor layer SEC2 may be defined based on a direction from the first semiconductor layer SEC1 to the second semiconductor layer SEC2.

For example, according to an embodiment, the second semiconductor layer SEC2 and the active layer AL from which light may be more emitted may not overlap the (3-1)-th electrode ELT3-1, may be disposed adjacent to the first electrode ELT1, and thus light emission efficiency may be further improved.

As a result, according to an embodiment, the first light emitting element LDs1 with improved light emission efficiency is provided, a short defect between the first electrode ELT1 and the second electrode ELT2 may be prevented, and thus the display device with improved electrical reliability may be provided.

A structure of the pixel PXL according to FIG. 7 is described with reference to FIG. 9. FIG. 9 is an enlarged view of an area EA2 of FIG. 7. The technical contents overlapping or common to the above-described embodiments are simplified or omitted, and differences are described.

According to an embodiment, a separation distance between the first electrode ELT1 and the substrate SUB and between the second electrode ELT2 and the substrate SUB may be different. For example, the first electrode ELT1 may be disposed on the protective layer PSV, and the second electrode ELT2 may be disposed on the (3-1)-th electrode ELT3-1 disposed on the protective layer PSV. Accordingly, the second electrode ELT2 may be further spaced apart from the substrate SUB compared to the first electrode ELT1.

According to an embodiment, the first insulating layer INS1 may have a different thickness according to a position thereof. For example, the first insulating layer INS1 overlapping the first electrode ELT1 may have a first thickness 332. The first insulating layer INS1 overlapping the second electrode ELT2 may have a second thickness 334. The first thickness 332 may be greater than the second thickness 334. At least a portion of the first insulating layer INS1 overlapping the (3-1)-th electrode ELT3-1 and the second electrode ELT2 may have a thickness thinner than that of another portion of the first insulation layer INS1 overlapping the first electrode ELT1, and thus a step difference of a contact surface may be prevented in case that the first light emitting elements LDs1 are arranged or disposed.

Hereinafter, a method of manufacturing a display device according to an embodiment is described with reference to FIGS. 10 to 16.

Figure 10:
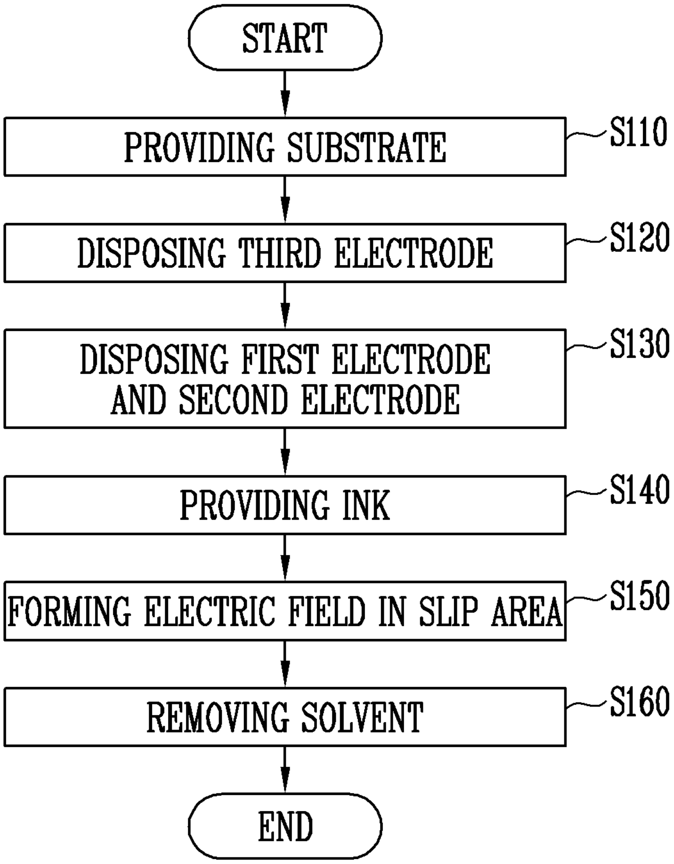
FIG. 10 is a flowchart illustrating a method of manufacturing a display device according to an embodiment.

FIG. 10 is a flowchart illustrating a method of manufacturing a display device according to an embodiment. FIGS. 11, 12, 14, and 16 are schematic cross-sectional views for each process step related to a method of manufacturing a display device according to an embodiment of the disclosure. FIGS. 13 and 15 are schematic plan views for each process step related to a method of manufacturing a display device according to an embodiment.

FIGS. 11, 12, 14, and 16 show the cross-section taken along line I~I' of FIG. 4. FIGS. 13 and 15 show a process performed in an area EA3 of FIG. 4 in a plan view form. In a description related to FIGS. 11 to 16, the disclosure is described based on the third electrode ELT3 and the light emitting element LD.

Referring to FIG. 10, a method of manufacturing a display device according to an embodiment may include providing a substrate (S110), disposing a third electrode (S120), disposing a first electrode and a second electrode (S130), providing an ink (S140), forming an electric field in a slip area (S150), and removing a solvent (S160).

Figure 11:
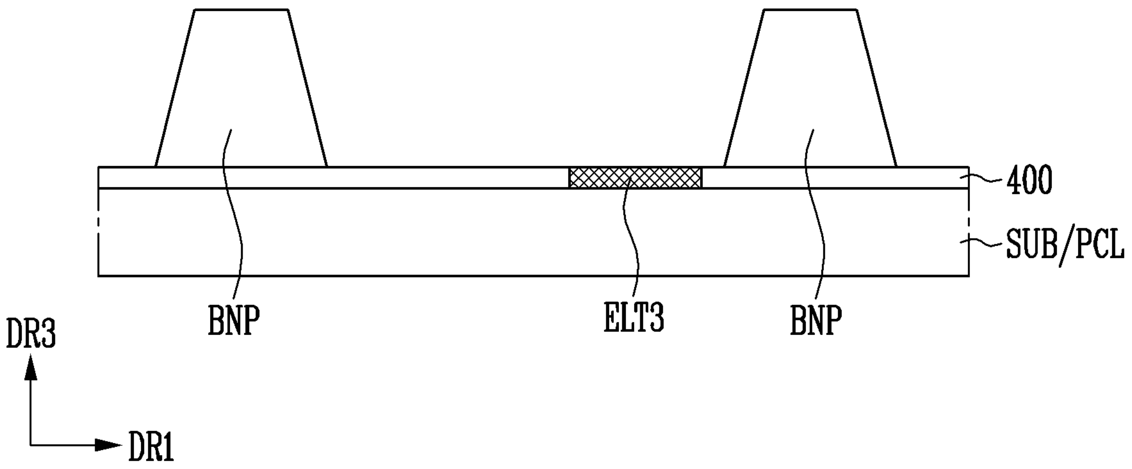
FIGS. 11, 12, 14, and 16 are schematic cross-sectional views for each process step related to a method of manufacturing a display device according to an embodiment.

Referring to FIGS. 10 and 11, in the providing step S110, the substrate SUB may be provided (or prepared), and the pixel circuit portion PCL may be disposed on the substrate SUB. The substrate SUB may be the substrate SUB described above with reference to FIG. 5. The individual configurations of the pixel circuit portion PCL disposed on the substrate SUB may be formed by patterning a conductive layer (or a metal layer), an inorganic material, an organic material, or the like by performing a process using a mask.

Referring to FIGS. 10 and 11, in disposing the third electrode (S120), the third electrode ELT3 may be disposed on the substrate SUB. The third electrode ELT3 may be patterned on the protective layer PSV of the pixel circuit portion PCL. After the third electrode ELT3 is formed, the insulating portion 400 may be disposed on the protective layer PSV, and the bank pattern BNP may be formed on the insulating portion 400. The insulating portion 400 may not be formed on the third electrode ELT3, but is not limited thereto. According to an embodiment, the bank pattern BNP may be formed so as not to overlap the third electrode ELT3.

Figure 12:
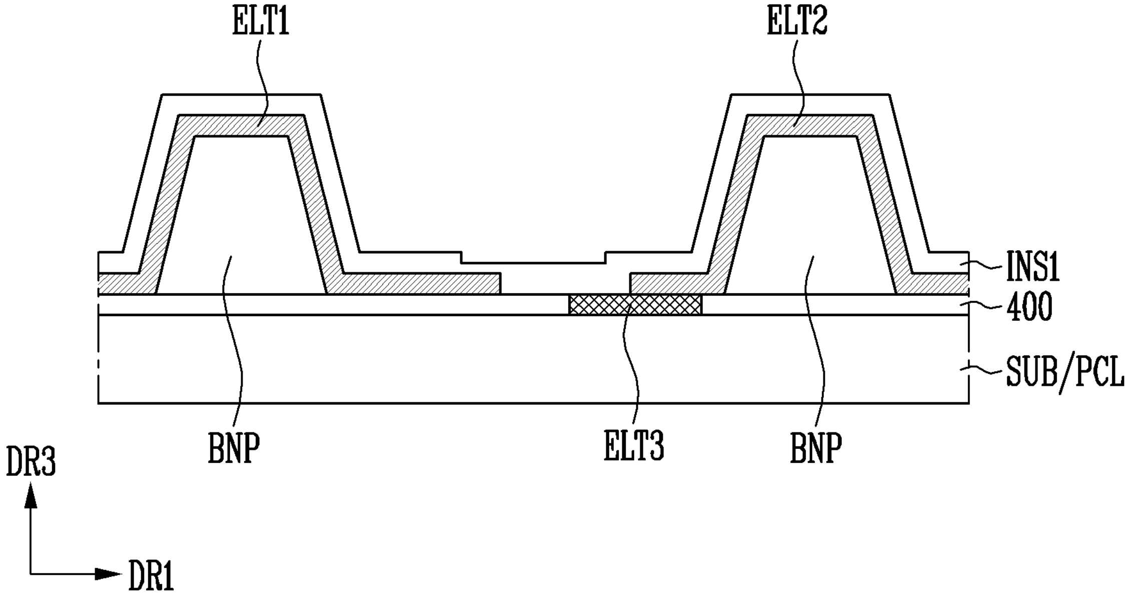
Figure 13:
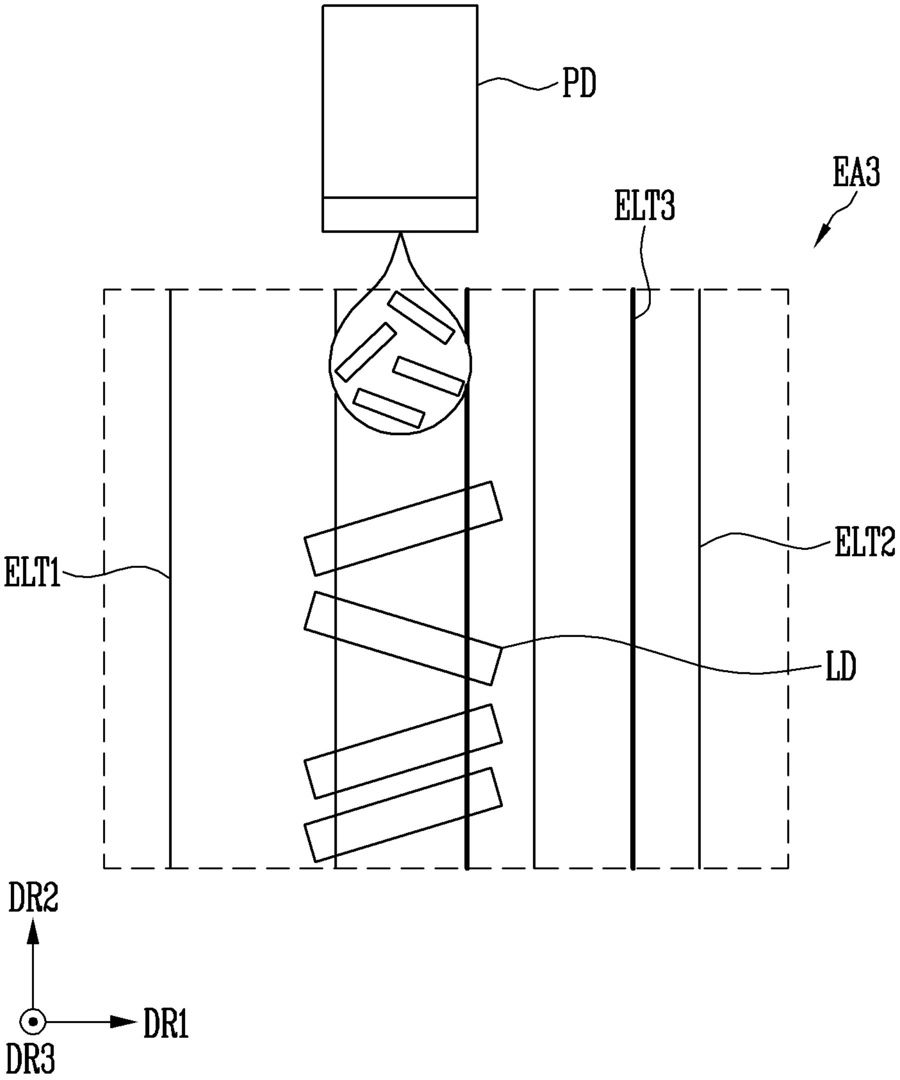
FIGS. 13 and 15 are schematic plan views for each process step related to a method of manufacturing a display device according to an embodiment.

Referring to FIGS. 10 and 12, in disposing the first electrode and the second electrode (S130), the first electrode ELT1 and the second electrode ELT2 may be formed. The first electrode ELT1 and the second electrode ELT2 may be provided by a photolithography process. The first electrode ELT1 may be disposed so as not to overlap the third electrode ELT3 in a plan view, and the second electrode ELT2 may be disposed to overlap the third electrode ELT3 in a plan view. In the step, the second electrode ELT2 may be electrically connected to the third electrode ELT3. Thereafter, the first insulating layer INS1 may be formed to cover or overlap the first electrode ELT1 and the second electrode ELT2.

Figure 14:
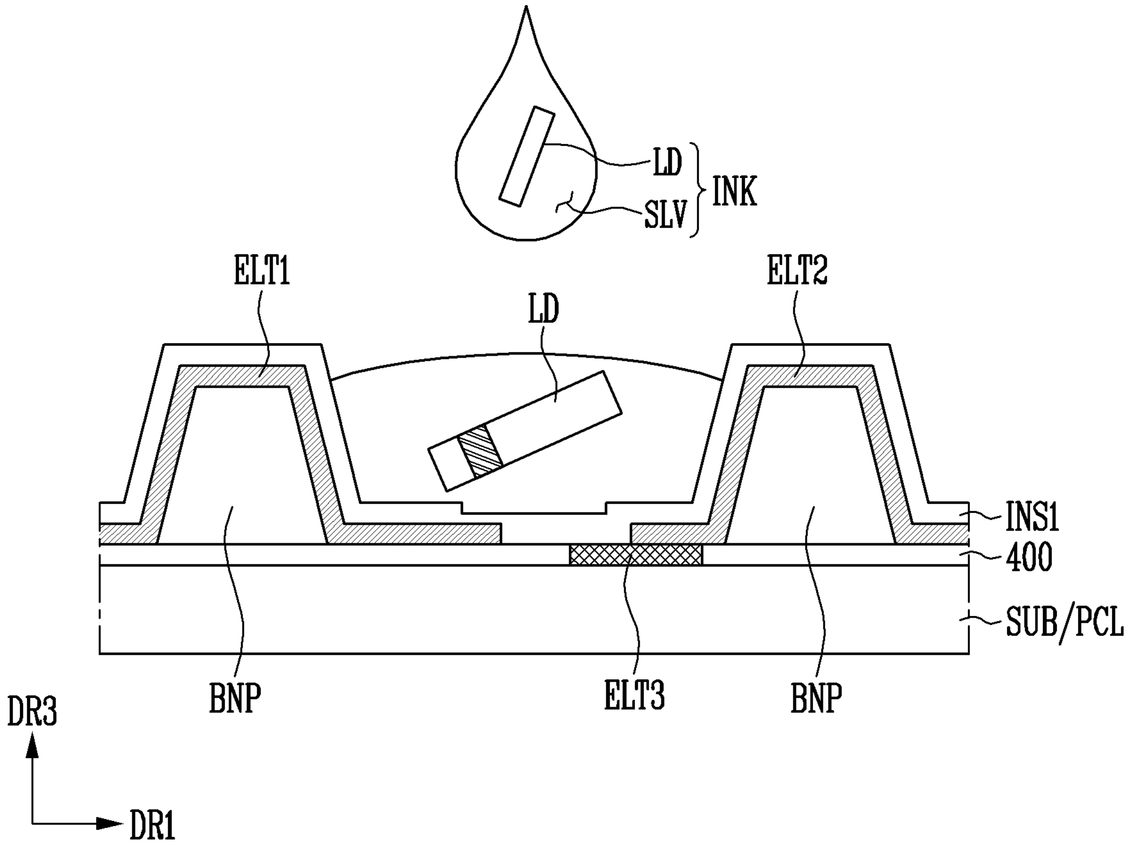
Figure 15:
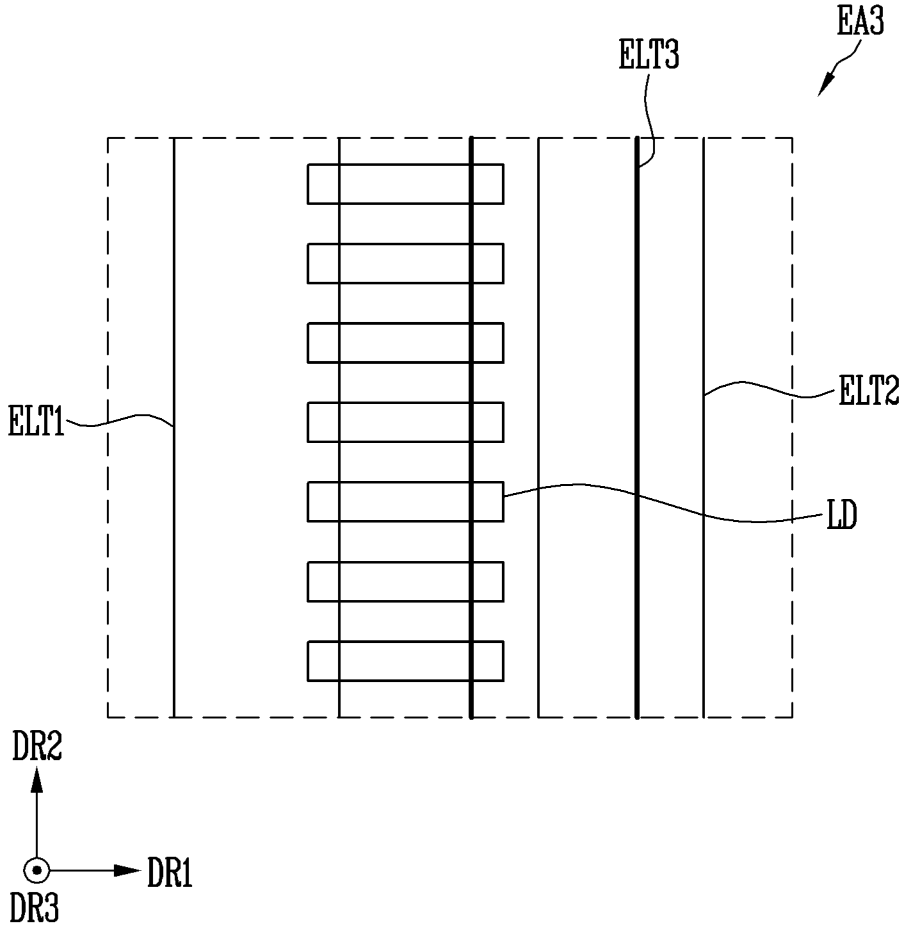

Referring to FIGS. 10, 13, and 14, in providing the ink (S140), the light emitting element LD may be provided on the substrate SUB. In the step, a printing device PD may provide an ink INK to an area where the light emitting element LD is to be arranged or disposed. The ink INK may be provided (or sprayed) by the printing device PD to discharge a liquid fluid to the outside. The printing device PD may include a nozzle portion to output the liquid fluid to the outside. The ink INK may include a liquid mixture that may be output by the printing device PD.

According to an embodiment, in the step, the printing device PD may provide (or spray) the ink INK while moving along the second direction DR2 with respect to the area where the light emitting element LD is to be arranged or disposed. At least some of the provided ink INK may be positioned between the first electrode ELT1 and the second electrode ELT2. At least some of the provided ink INK may be positioned between the first electrode ELT1 and the third electrode ELT3.

According to an embodiment, the ink INK may include a solvent SLV and the light emitting element LD. Light emitting elements LD may be provided and dispersed in the solvent SLV having a fluid property. The solvent SLV may mean a material other than a solid phase in which the light emitting elements LDs may be dispersed and arranged or disposed.

Figure 16:
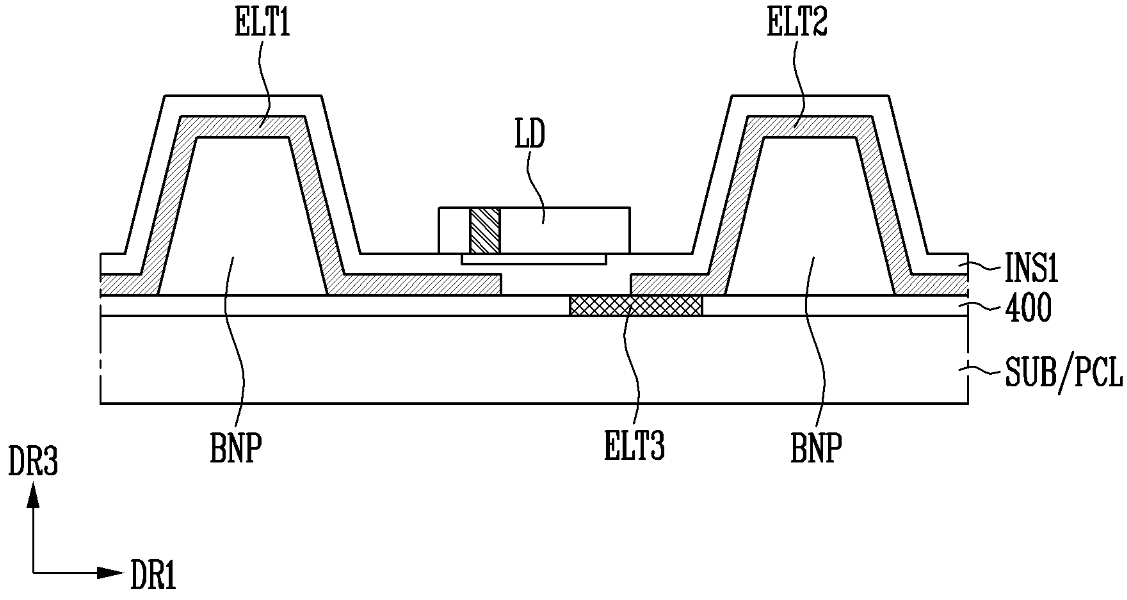

Referring to FIGS. 10, 15, and 16, in forming the electric field in the slip area (S150), the electric field may be formed between the first electrode ELT1, the second electrode ELT2, and the third electrode ELT3. The slip area may mean an area in which the light emitting elements LDs are arranged or disposed. The slip area may include an area between the first electrode ELT1 and the third electrode ELT3.

According to an embodiment, in the step, by applying an alignment signal to each of the first electrode ELT1 and the second electrode ELT2, an alignment electric field may be formed (or provided) between the first electrode ELT1 and the second electrode ELT2, and the light emitting elements LD included in the ink INK may be aligned between the first electrode ELT1 and the second electrode ELT2 by the formed alignment electric field. At this time, an AC signal may be applied between the first electrode ELT1 and the second electrode ELT2. The AC signal may be a sine wave, a triangular wave, a staircase wave, or the like, but is not limited to a given example and may have various AC signal types.

According to an embodiment, the first electrical signal may be output from the first electrode ETL1, and the second electrical signal different from the first electrical signal may be output from the second electrode ELT2 and the third electrode ELT3. At this time, the alignment electric field for aligning the light emitting element LD may be provided based on the first electrical signal and the second electrical signal.

According to an embodiment, the second electrode ELT2 may be electrically connected to the third electrode ELT3, and the electric field may be formed between the first electrode ELT1 and the third electrode ELT3. For example, the alignment signal provided from the second electrode ELT2 may also be output from the distal end portion of the third electrode ELT3. Accordingly, an effect that an electrode structure to which the alignment signal is provided extends from the second electrode ELT2 by a position of the third electrode ELT3 may be provided. As a result, the light emitting element LD may be arranged or disposed in the slip area defined by the first electrode ELT1 and the third electrode ELT3 along the second direction DR2.

Referring to FIGS. 10 and 16, in removing the solvent (S160), the solvent SLV included in the ink INK may be removed. However, according to an embodiment, a separate removal process for the solvent SLV may not be performed, and the solvent SLV may be removed by volatilization. In case that the step is performed, a position of the light emitting element LD may be stably arranged or disposed and fixed on the first insulating layer INS1.

Thereafter, although not separately shown in the drawings, an additional process may be performed to form the second insulating layer INS2, the first contact electrode CNE1, the second contact electrode CNE2, the third insulating layer INS3, and the fourth insulating layer INS4 described above with reference to FIG. 5, and the display device according to an embodiment may be manufactured.

The above description is merely an example of the technical spirit and scope of the disclosure, and those skilled in the art to which the disclosure pertains will be able to make various modifications and variations without departing from the characteristics of the disclosure. Therefore, embodiments described above may be implemented separately or in combination with each other.

Therefore, the embodiments disclosed in the disclosure are not intended to limit the technical spirit and scope of the disclosure, but to describe the technical spirit and scope of the disclosure, and the scope of the disclosure is not limited by these embodiments. The scope of the disclosure should be interpreted by the following claims, and it should be interpreted that all technical spirits and scopes within the equivalent scope are included in the scope of the disclosure.

What is claimed is:

1. A display device comprising:

a first electrode and a second electrode above a substrate;

at least one light-emitting element comprising:

a first semiconductor layer including a semiconductor of a first type;

a second semiconductor layer including a semiconductor of a second type different from the first type; and an active layer between the first semiconductor layer and the second semiconductor layer;

a connection electrode on the substrate that electrically connects the second electrode to the at least one light-emitting element;

a third electrode above the substrate, electrically connected to the second electrode, having a portion between the first electrode and the second electrode in a plan view, directly contacting a bottom surface of the second electrode, overlapping the at least one light-emitting element in a plan view; and an insulating portion above the substrate, the insulating portion and the third electrode being at a same layer, wherein at least a portion of an upper surface of the third electrode is not covered by the second electrode, the upper surface being overlapped with the light-emitting element in a plan view, wherein the insulating portion is in contact with a lower surface of the first electrode and a distal end portion of the third electrode, wherein the first electrode does not overlap the third electrode in a plan view, and wherein the second electrode overlaps the third electrode in a plan view.

2. The display device according to claim 1, wherein the second electrode and the third electrode physically contact each other.

3. The display device according to claim 1, wherein the first semiconductor layer is closer to the second electrode than to the first electrode, wherein the second semiconductor layer is closer to the first electrode than to the second electrode, and wherein a height of the first semiconductor layer is greater than a height of the second semiconductor layer in a direction from the first semiconductor layer to the second semiconductor layer.

4. The display device according to claim 3, wherein the first semiconductor layer includes an N-type semiconductor, and wherein the second semiconductor layer includes a P-type semiconductor.

5. The display device according to claim 3, wherein the second semiconductor layer overlaps the first electrode in a plan view.

6. The display device according to claim 5, wherein the active layer is closer to the first electrode than to the second electrode in a plan view.

7. The display device according to claim 1, wherein the at least one light-emitting element includes a light-emitting element overlapping the first electrode in a plan view, wherein the third electrode includes a first area overlapping the light-emitting element and a second area overlapping the second electrode in a plan view, and wherein the first area and the second area are spaced apart from each other.

8. The display device according to claim 1, wherein the first electrode and the second electrode are spaced apart by a first distance, wherein the first electrode and the third electrode are spaced apart by a second distance, and wherein the first distance of the first electrode and the second electrode is greater than the second distance of the first electrode and the third electrode.

9. The display device according to claim 8, wherein the distal end portion of the third electrode is spaced apart from the second electrode by a third distance, wherein the first distance is about 3 μm or more, and wherein the third distance is in a range of about 1 μm to about 2.5 μm.

10. The display device according to claim 1, wherein the first electrode is above the insulating portion, and wherein a separation distance between the first electrode and the substrate and a separation distance between the second electrode and the substrate are equal.

11. The display device according to claim 1, wherein the third electrode includes a reflective material.

12. The display device according to claim 1, further comprising a connection pattern above the substrate and at a same layer as the third electrode.

13. An electronic device comprising the display device of claim 1.

14. A display device comprising:

a first electrode and a second electrode above a substrate;

at least one light-emitting element comprising:

a first semiconductor layer comprising a semiconductor of a first type;

a second semiconductor layer comprising a semiconductor of a second type different from the first type; and an active layer between the first semiconductor layer and the second semiconductor layer;

a connection electrode on the substrate that electrically connects the second electrode to the at least one light-emitting element;

a third electrode above the substrate, electrically connected to the second electrode, having a portion between the first electrode and the second electrode in a plan view, directly contacting a bottom surface of the second electrode, and overlapping the at least one light-emitting element in a plan view; and an insulating portion above the substrate and at a same layer as the third electrode, wherein at least a portion of an upper surface of the third electrode is not covered by the second electrode, the upper surface being overlapped with the light-emitting element in a plan view, wherein the insulating portion is in contact with a lower surface of the first electrode and a distal end portion of the third electrode, wherein the first electrode and the second electrode are spaced apart in a first direction, wherein the first electrode and the third electrode are spaced apart in the first direction, and wherein the first electrode, the second electrode, and the third electrode extend in a second direction intersecting the first direction.

* * * * *